United States Patent
Sato et al.

(10) Patent No.: US 9,991,187 B2
(45) Date of Patent: Jun. 5, 2018

(54) ELECTRONIC DEVICE AND METHOD FOR MANUFACTURING THE SAME, AND SUBSTRATE STRUCTURE AND METHOD FOR MANUFACTURING THE SAME

(71) Applicant: FUJITSU LIMITED, Kawasaki-shi, Kanagawa (JP)

(72) Inventors: Motonobu Sato, Isehara (JP); Mizuhisa Nihei, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 48 days.

(21) Appl. No.: 14/802,248

(22) Filed: Jul. 17, 2015

(65) Prior Publication Data
US 2015/0325495 A1   Nov. 12, 2015

Related U.S. Application Data

(63) Continuation of application No. PCT/JP2013/078044, filed on Oct. 16, 2013.

(30) Foreign Application Priority Data

Jan. 18, 2013 (JP) .................. 2013-007736

(51) Int. Cl.
*H01L 23/34* (2006.01)
*H01L 23/373* (2006.01)
(Continued)

(52) U.S. Cl.
CPC ........ *H01L 23/3738* (2013.01); *H01L 21/481* (2013.01); *H01L 23/3178* (2013.01);
(Continued)

(58) Field of Classification Search
CPC ............... H01L 23/367; H01L 23/3178; H01L 25/0657; H01L 23/373; H01L 2221/1094
See application file for complete search history.

(56) References Cited

U.S. PATENT DOCUMENTS 6,225,695 B1   5/2001 Chia
2005/0067693 A1*   3/2005 Nihei ................ B82Y 10/00
                                                          257/720
(Continued)

FOREIGN PATENT DOCUMENTS

JP          11-74431      3/1999
JP    2005-109133 A1      4/2005
(Continued)

OTHER PUBLICATIONS

Office Action of Taiwanese Patent Application 102138057 dated Oct. 26, 2015, with translation of the relevant part of the Office Action.
(Continued)

*Primary Examiner* — Khiem D Nguyen
(74) *Attorney, Agent, or Firm* — Kratz, Quintos & Hanson, LLP

(57) ABSTRACT

A semiconductor device includes: a silicon substrate that includes a heat release mechanism formed on a rear surface thereof; and an element layer that includes a transistor element and is formed on a front surface of the silicon substrate, the heat release mechanism including: a carbon material being a high heat-conducting material such as a CNT that is higher in heat conductivity than the silicon substrate and is formed in a plurality of first holes formed in the rear surface of the silicon substrate; and a carbon material being a heat-conductive film such as a multilayer graphene film that is thermally connected to the CNT in a manner to cover a rear surface side of the silicon substrate. This configuration provides a carbon material-embedded silicon substrate realizing very efficient heat release with a relatively simple configuration to obtain a highly-reliable electronic device.

10 Claims, 25 Drawing Sheets

(51) Int. Cl.
 H01L 23/31 (2006.01)
 H01L 25/065 (2006.01)
 H01L 23/00 (2006.01)
 H01L 23/367 (2006.01)
 H01L 27/06 (2006.01)
 H01L 21/48 (2006.01)

(52) U.S. Cl.
 CPC ........ H01L 23/367 (2013.01); H01L 23/3677 (2013.01); H01L 23/373 (2013.01); H01L 23/3737 (2013.01); H01L 24/32 (2013.01); H01L 25/0657 (2013.01); H01L 27/0688 (2013.01); H01L 21/4882 (2013.01); H01L 2224/32145 (2013.01); H01L 2225/06589 (2013.01); H01L 2924/0002 (2013.01); H01L 2924/01006 (2013.01); H01L 2924/17793 (2013.01)

(56) References Cited

U.S. PATENT DOCUMENTS

2006/0278901 A1* 12/2006 Dangelo ............. H01L 23/3677
 257/276
2008/0237858 A1* 10/2008 Nihei ................ H01L 21/76831
 257/746
2009/0121343 A1* 5/2009 Basker ................... B82Y 10/00
 257/713
2009/0189276 A1* 7/2009 Sano ................. H01L 27/14618
 257/713
2012/0199815 A1* 8/2012 Kondo ............. H01L 21/02381
 257/29

FOREIGN PATENT DOCUMENTS

| JP | 2009-164152 | * | 7/2009 | ........... H01L 25/065 |
| JP | 2009-164152 A1 | | 7/2009 | |
| JP | 2009-206496 A1 | | 9/2009 | |
| JP | 2010-50170 A1 | | 3/2010 | |
| JP | 2010-114120 A1 | | 5/2010 | |
| JP | 2010-192491 A1 | | 9/2010 | |

OTHER PUBLICATIONS

International Search Report for International Application No. PCT/JP2013/078044 dated Jan. 21, 2014.

Japanese Application No. 2013-007736: Decision of Refusal dated Feb. 3, 2017.

* cited by examiner

ELECTRONIC DEVICE AND METHOD FOR MANUFACTURING THE SAME, AND SUBSTRATE STRUCTURE AND METHOD FOR MANUFACTURING THE SAME

CROSS-REFERENCE TO RELATED APPLICATIONS

This application is a continuation application of International Application PCT/JP2013/078044 filed on Oct. 16, 2013 and designated the U.S., which claims the benefit of priority of the prior Japanese Patent Application No. 2013-007736, filed on Jan. 18, 2013, the entire contents of which are incorporated herein by reference.

FIELD

The embodiments discussed herein are directed to an electronic device and a method for manufacturing the same, and a substrate structure and a method for manufacturing the same.

BACKGROUND

In recent years, there is an electronic device, for example, a semiconductor device in which the connection between a semiconductor substrate and a heat sink is improved as a heat release technique (see Patent Documents 1, 2). There is further devised a configuration of releasing heat by directly connecting a material high in heat conductivity to a heating element of the semiconductor device (see Patent Document 3).

[Patent Document 1] Japanese Laid-open Patent Publication No. 2010-50170
[Patent Document 2] Japanese Laid-open Patent Publication No. 2010-114120
[Patent Document 3] Japanese Laid-open Patent Publication No. 2005-109133

At present, there is no heat release mechanism for the electronic device in which attention is paid to improvement in heat resistance of the substrate itself. In the present circumstances, very efficient heat release with a relatively simple configuration is expected to be enabled by improving the heat release performance of the substrate, and further research and development is awaited.

SUMMARY

An electronic device of the present invention includes: a substrate that includes a heat release mechanism formed on a rear surface thereof; and an element layer that includes a functional element and is formed on a front surface of the substrate, the heat release mechanism including: a first high heat-conducting material that is higher in heat conductivity than the substrate and is formed in a plurality of first holes formed in the rear surface of the substrate; and a first heat-conductive film that is thermally connected to the first high heat-conducting material in a manner to cover a rear surface side of the substrate.

A substrate structure of the present invention includes: a substrate; and a heat release mechanism formed on a rear surface of the substrate, the heat release mechanism including: a high heat-conducting material that is higher in heat conductivity than the substrate and is formed to be embedded in a plurality of holes formed in the rear surface of the substrate, from a bottom surface to a middle depth of the hole; and a sealing material that is embedded in a remaining portion in the hole from a front surface of the substrate to seal the high heat-conducting material in the substrate.

A method for manufacturing an electronic device of the present invention includes: forming a plurality of first holes in a rear surface of a substrate; forming a first high heat-conducting material that is higher in heat conductivity than the substrate, in the first hole; forming an element layer that includes a functional element, on a front surface of the substrate; and forming a first heat-conductive film that is to be thermally connected to the first high heat-conducting material in a manner to cover a rear surface side of the substrate.

A method for manufacturing a substrate structure of the present invention includes: forming a plurality of holes in a rear surface of a substrate; forming a high heat-conducting material higher in heat conductivity than the substrate to embed the high heat-conducting material in the hole from a bottom surface to a middle depth of the hole; and embedding a sealing material in the hole from a front surface of the substrate to seal the high heat-conducting material in the substrate.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, concrete embodiments to which the present invention is applied will be described in detail with reference to the drawings.

First Embodiment

In this embodiment, a configuration of a substrate structure to be applied to an electronic device will be disclosed together with its manufacturing method. Here, a substrate structure of a semiconductor substrate to be applied to a semiconductor device will be described.

FIG. 1 to FIG. 5 are schematic cross-sectional views illustrating a method for manufacturing a substrate structure according to a first embodiment in order of processes.

Figure 1:
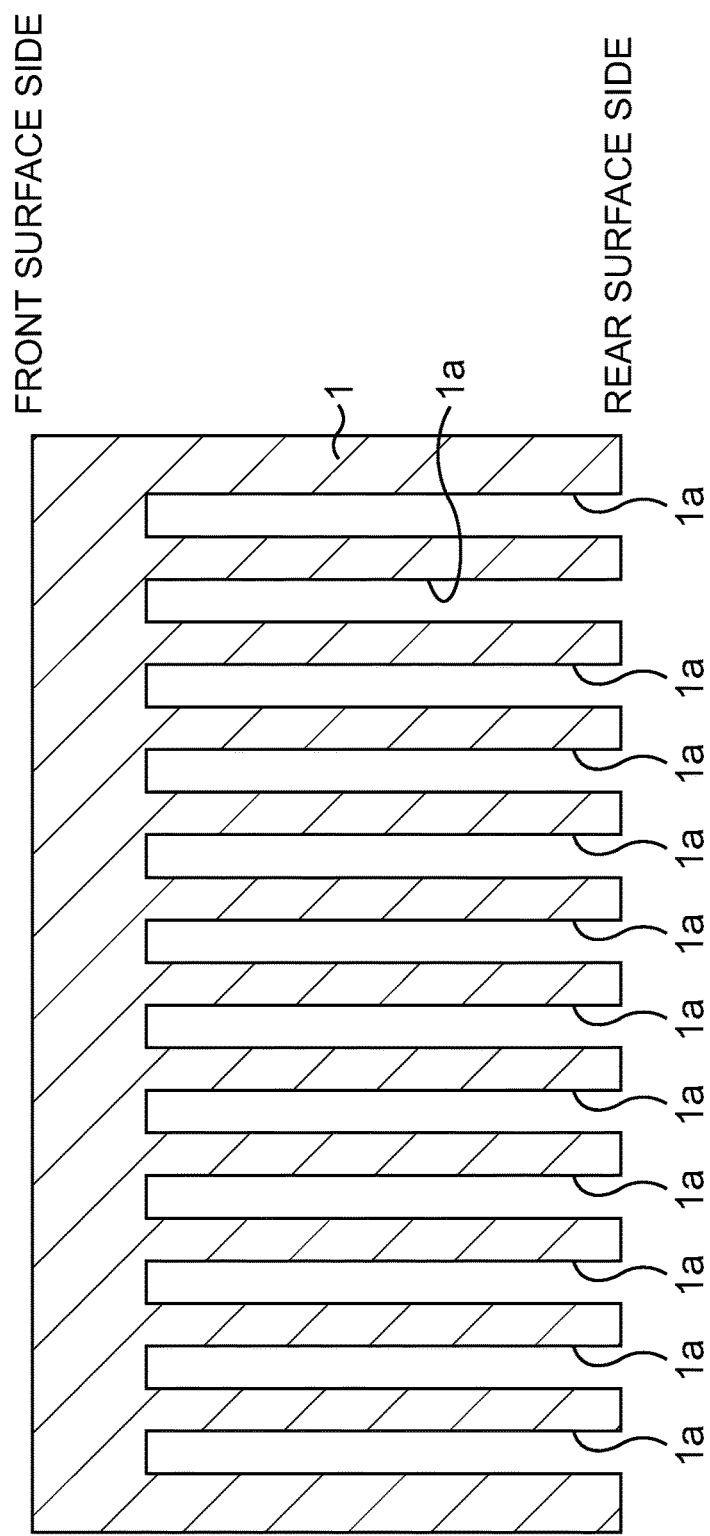
FIG. 1 is a schematic cross-sectional view illustrating a method for manufacturing a substrate structure according to a first embodiment in order of processes.

First, as illustrated in FIG. 1, a plurality of holes 1a are formed in a rear surface of a silicon substrate 1.

As a substrate, for example, a silicon substrate 10 is prepared. The silicon substrate 1 has been made to have a thickness of, for example, about 775 μm.

The rear surface of the silicon substrate 1 is processed down to a predetermined depth by lithography and dry etching. This forms a plurality of non-penetrating holes 1a in the rear surface of the silicon substrate 1. The hole 1a has, for example, a diameter of about 20 μm to about 100 μm, here, about 50 μm, and a depth equal to or less than the thickness of the substrate, for example, about 700 μm.

Figure 2:
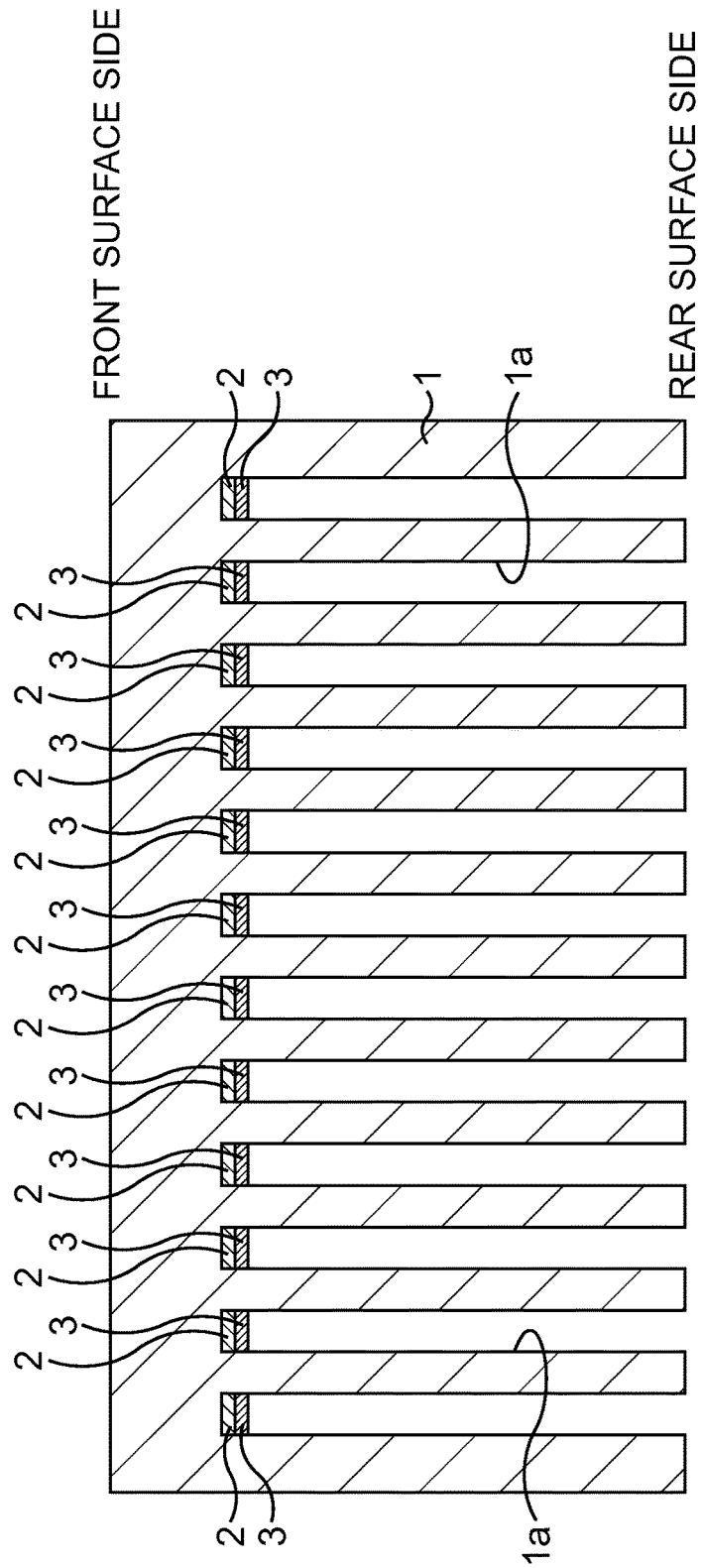
FIG. 2 is a schematic cross-sectional view illustrating, subsequent to FIG. 1, the method for manufacturing a substrate structure according to the first embodiment in order of processes.

Subsequently, as illustrated in FIG. 2, at a bottom surface of each of the holes 1a of the silicon substrate 1, a base material 2 and a catalyst material 3 are formed in sequence.

In more detail, first, Ta, TaN or the like is deposited into a thickness of about 15 nm, for instance, by an ALD method, a sputtering method or the like. This forms the base material 2 being a barrier metal at the bottom surface and a side surface of the hole 1a of the silicon substrate 1.

Then, the catalyst material is deposited into a thickness of several nanometers, for example, about 1 nm by the vacuum deposition method or the like. As the catalyst material, a mixed material of one kind or two or more kinds selected from among Co, Ni, Fe and so on and one kind or two or more kinds selected from among Ti, TiN, $TiO_2$, V, Al and so on is used. For example, Co/Ti or Co/V is selected. This forms the catalyst material 3 on the base material 2 at the bottom surface of the hole 1a of the silicon substrate 1.

Thereafter, oblique milling is performed on the rear surface of the silicon substrate 1 to remove the base material and the catalyst material deposited on the rear surface of the silicon substrate 1. Alternatively, oblique deposition may be performed on the rear surface of the silicon substrate 1 to inactivate the catalyst material deposited on the rear surface of the silicon substrate 1.

Figure 3:
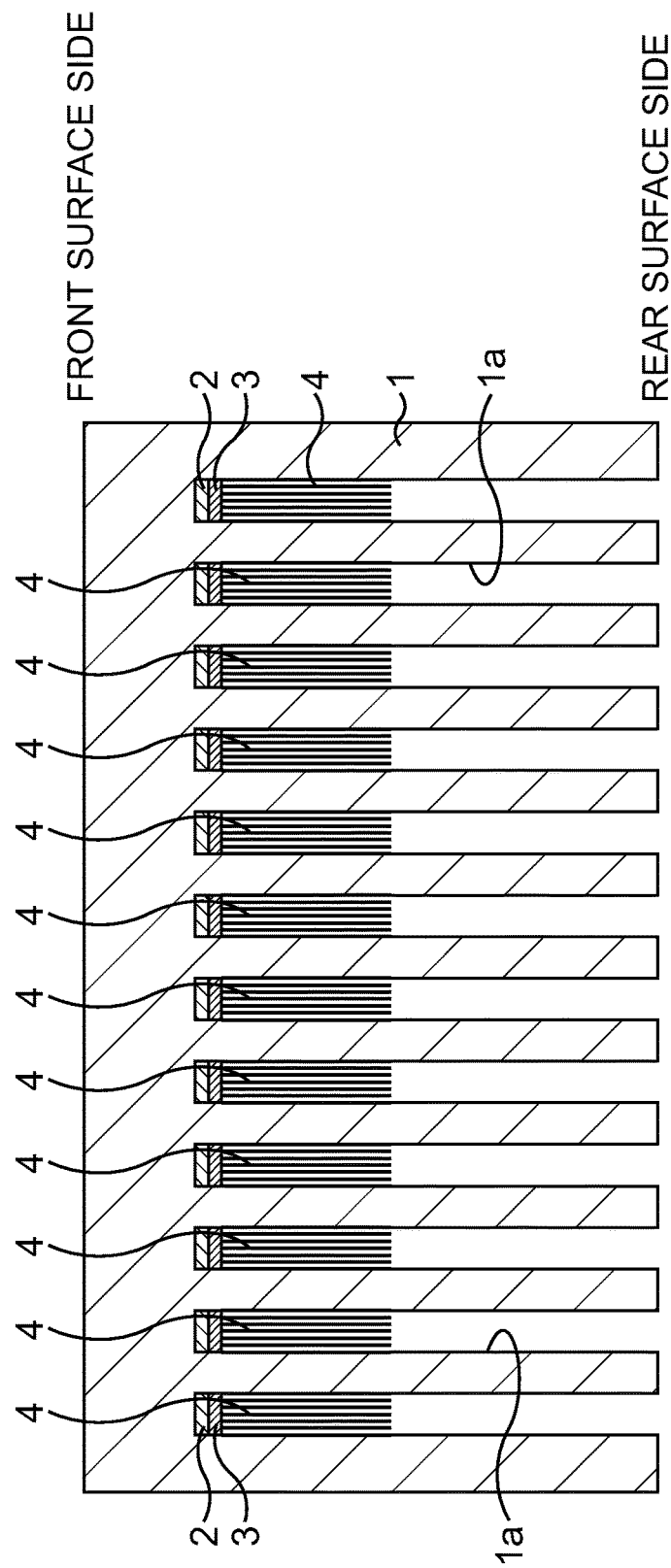
FIG. 3 is a schematic cross-sectional view illustrating, subsequent to FIG. 2, the method for manufacturing a substrate structure according to the first embodiment in order of processes.

Subsequently, as illustrated in FIG. 3, a high heat-conducting material, for example, a CNT 4 is formed in the hole 1a.

Figure 6:
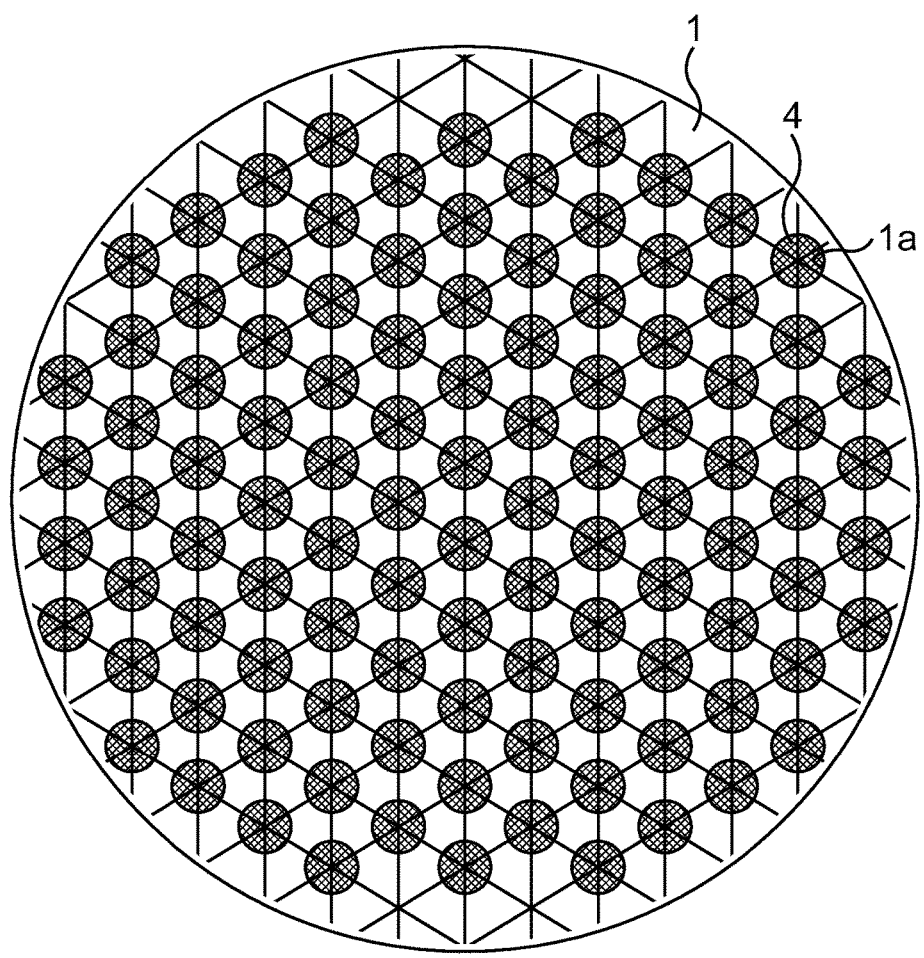
FIG. 6 is a schematic plan view illustrating an appearance of a rear surface of a silicon substrate in FIG. 3.

In more detail, the plasma CVD method or the thermal CVD method is used to perform growth processing of carbon nanotube (CNT) with a growth temperature set to equal to or lower than the melting point of the substrate material, for example, about 800° C. and the application direction of an electric field set to a direction perpendicular to the substrate surface. Thus, a CNT 4 is formed to stand up from the catalyst material 3 existing at the bottom surface of the hole 1a. The CNT 4 is formed to such a length as not to fill up the hole 1a, for example, a length of about 200 μm. The CNT is a material higher in heat conductivity and better in heat release performance than silicon that is the substrate material, and a configuration that the CNT 4 is partially embedded in each of the plurality of holes 1a of the silicon substrate 1 becomes a heat release mechanism for the electronic device to which the configuration is applied. The appearance of the rear surface of the silicon substrate 1 in this event is illustrated in FIG. 6.

Note that after the hole 1a is formed in the rear surface of the silicon substrate 1, the base material 2 and the catalyst material 3 may be formed without removing a resist mask used as a mask for the dry etching but with the resist mask kept formed. In this case, the resist mask is removed together with the base material and the catalyst material existing thereon by asking or wet etching using a predetermined chemical, and then the CNT 4 is formed as illustrated in FIG. 3.

Figure 4:
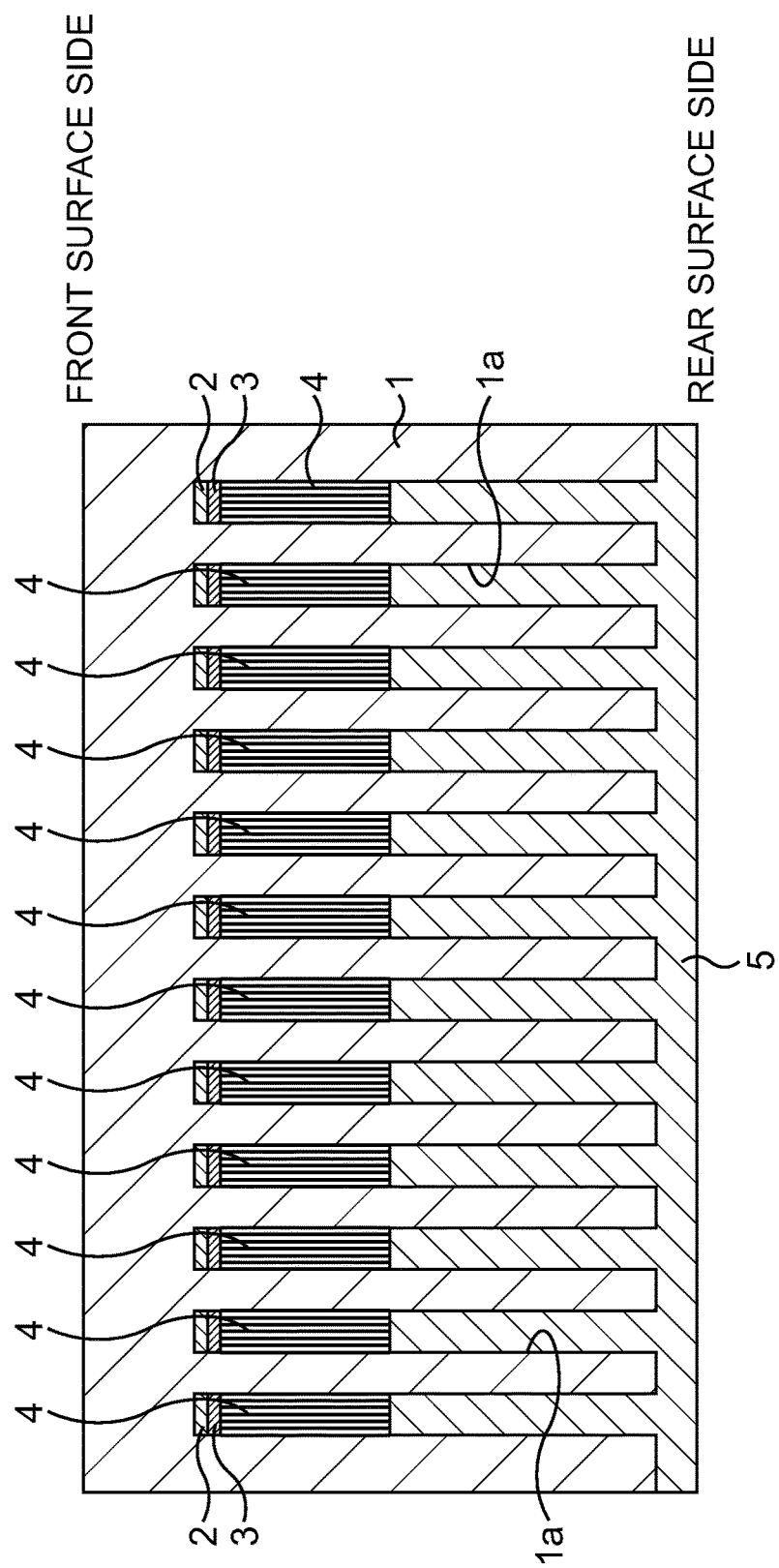
FIG. 4 is a schematic cross-sectional view illustrating, subsequent to FIG. 3, the method for manufacturing a substrate structure according to the first embodiment in order of processes.

Subsequently, as illustrated in FIG. 4, a sealing material 5 is embedded in the hole 1*a* from the rear surface of the silicon substrate 1 to seal the CNT 4.

In more detail, a sealing material resistant to various kinds of contamination, for example, an SOG (Spin On Glass) material is used as the sealing material 5 and embedded in a remaining portion of the hole 1*a* from the rear surface of the silicon substrate 1. Alternatively, plating of a material excellent in heat conductivity, for example, Cu may be performed or a nanodiamond material may be applied to be used as the sealing material 5. Thus, the CNT 4 formed in the hole 1*a* is sealed with the sealing material 5.

With the above, the substrate structure with the heat release mechanism according to this embodiment is formed.

In this embodiment, the sealing material 5 seals the CNT 4, whereby when the electronic device is formed using the substrate structure thereafter, the CNT 4 is not contaminated in its various processes but is kept in an expected state. Therefore, in the electronic device, a desired heat release mechanism can be surely formed.

Figure 5:
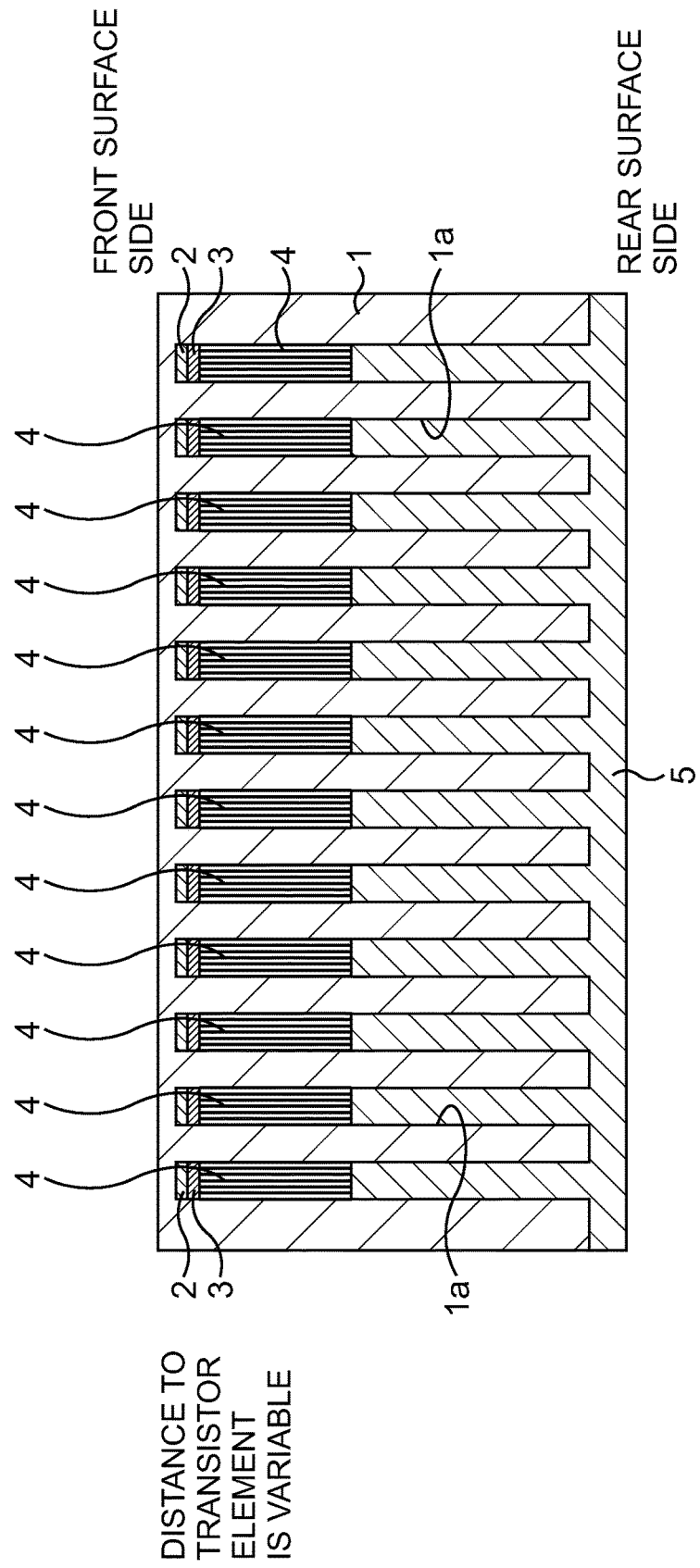
FIG. 5 is a schematic cross-sectional view illustrating, subsequent to FIG. 4, the method for manufacturing a substrate structure according to the first embodiment in order of processes.

Note that, as illustrated in FIG. 5, a front surface of the silicon substrate 1 may be ground by grinding or the like to such an extent as not to expose the base material 2 to thereby appropriately thin the silicon substrate 1.

As has been described above, according to the substrate structure according to this embodiment, the silicon substrate 1 itself has the heat release mechanism in a relatively simple configuration using a high heat-conducting material excellent in heat conduction, for example, a CNT. Applying this substrate structure to the electronic device such as the semiconductor device realizes a highly-reliable electronic device enabling highly effective heat release.

Second Embodiment

This embodiment discloses a semiconductor device including a transistor element with an MOS structure as a functional element, as the electronic device, together with a manufacturing method therefor. Note that a semiconductor device having various kinds of memory elements, capacitor elements and so on other than the MOS transistor in this embodiment as the functional element, is also applicable.

FIG. 7 to FIG. 16 are schematic cross-sectional views illustrating a method for manufacturing a semiconductor device according to a second embodiment in order of processes. Note that the same signs are given to the same components and so on as those of the substrate structure according to the first embodiment to omit their detailed description.

In this embodiment, the substrate structure disclosed in the first embodiment is applied to the semiconductor device.

Figure 7:
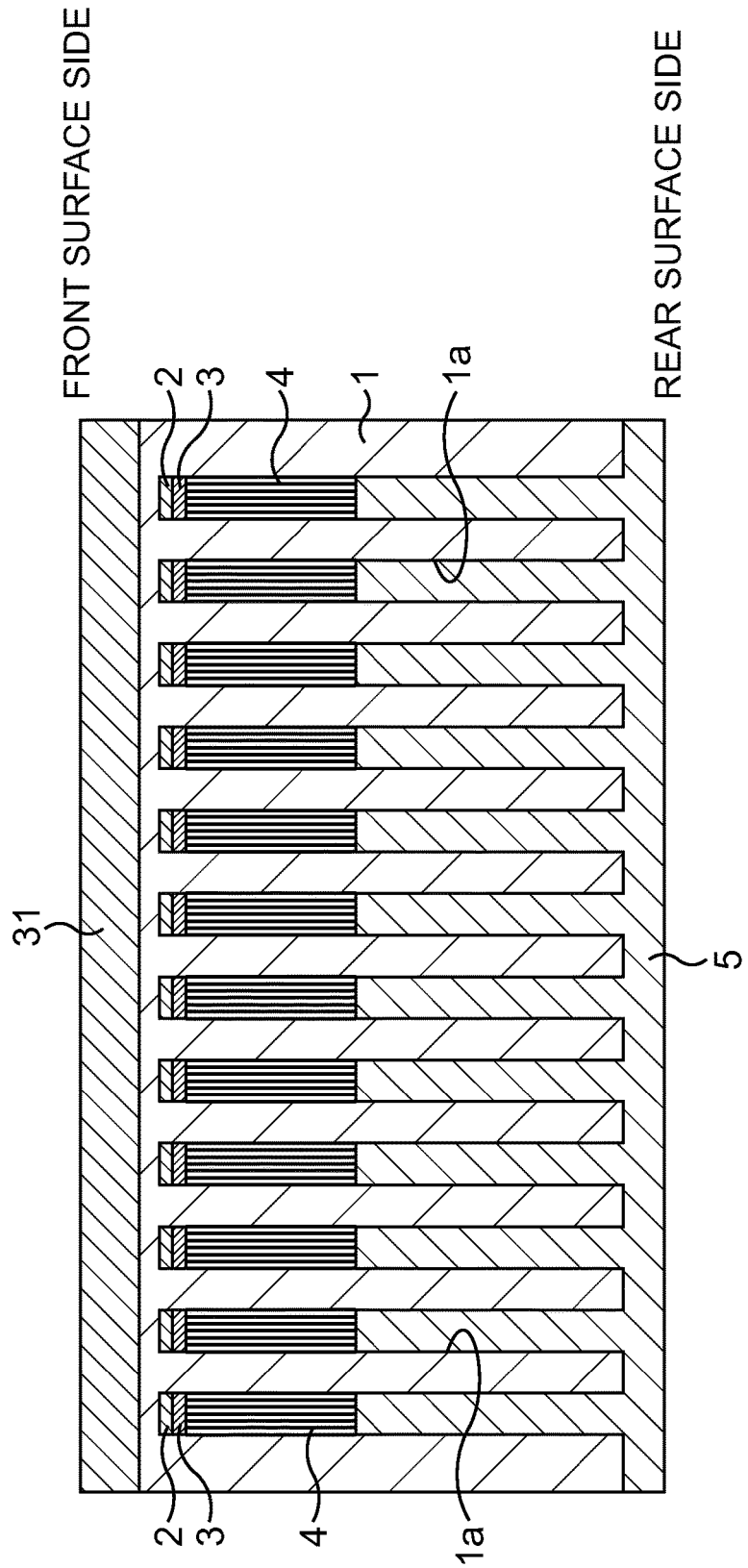
FIG. 7 is a schematic cross-sectional view illustrating a method for manufacturing a semiconductor device according to a second embodiment in order of processes.

First, as illustrated in FIG. 7, the substrate structure according to the first embodiment, that is, the substrate structure in FIG. 5 is used here, and an element layer 31 including a transistor element 20*a* with the MOS structure as the functional element and its wiring structure 20*b* is formed on the front surface of its silicon substrate 1.

A formation process of the element layer 31 will be described using FIG. 17A to FIG. 17C and FIG. 18A to FIG. 18B. Note that FIG. 17A to FIG. 17C and FIG. 18A to FIG. 18B illustrate only a surface layer portion of the silicon substrate 1.

Figure 17A:
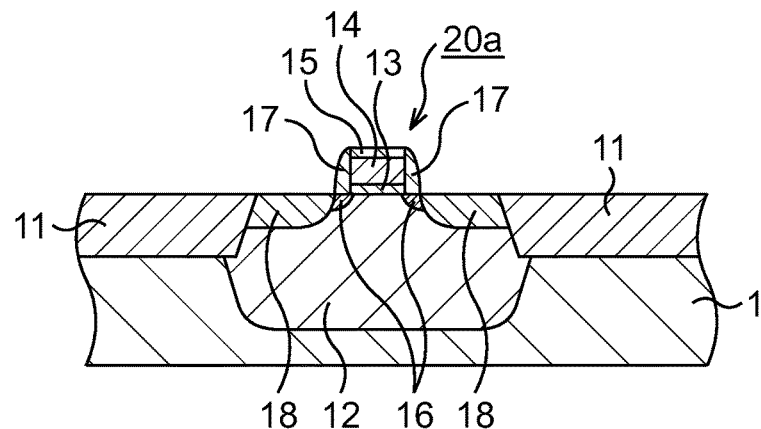
FIG. 17A is a schematic cross-sectional view illustrating the process in FIG. 7 in detail.

First, as illustrated in FIG. 17A, the transistor element 20*a* is formed.

In more detail, first, element isolation structures 11 are formed by, for example, the STI (Shallow Trench Isolation) method in the surface layer of the silicon substrate 1 to define an element active region.

Next, impurities of a predetermined conductivity type are ion-implanted into the element active region to form a well 12.

Then, a gate insulating film 13 is formed in the element active region by thermal oxidation or the like, a polycrystalline silicon film and a silicon nitride film are deposited on the gate insulating film 13 by the CVD method, and the silicon nitride film, the polycrystalline silicon film, and the gate insulating film 13 are processed by lithography and subsequent dry etching into an electrode shape to thereby pattern-form a gate electrode 14 on the gate insulating film 13. In this event, a cap film 15 made of a silicon nitride film is simultaneously pattern-formed on the gate electrode 14.

Then, impurities of a reverse conductivity type to that of the well 12 are ion-implanted to the element active region using the cap film 15 as a mask to form so-called extension regions 16.

Then, for example, a silicon oxide film is deposited on the entire surface by the CVD method, and so-called etchback is performed on the silicon oxide film to leave the silicon oxide film only on side surfaces of the gate electrode 14 and the cap film 15 to thereby form sidewall insulating films 17.

Then, impurities of the same conductivity type as that of the extension regions 16 are ion-implanted into the element active region using the cap film 15 and the sidewall insulating films 17 as a mask to form source/drain regions 18 overlapped on the extension regions 16. Thus, the transistor element 20*a* is formed.

Figure 17B:
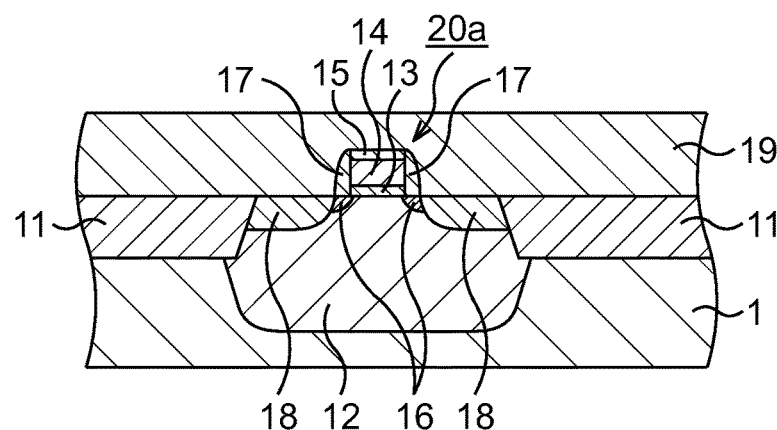
FIG. 17B is a schematic cross-sectional view illustrating, subsequent to FIG. 17A, the process in FIG. 7 in detail.

Subsequently, as illustrated in FIG. 17B, an interlayer insulating film 19 is formed.

In more detail, for example, a silicon oxide is deposited to cover the transistor element 20*a* to form the interlayer insulating film 19. The interlayer insulating film 19 is ground at its surface by chemical mechanical polishing (CMP).

Figure 17C:
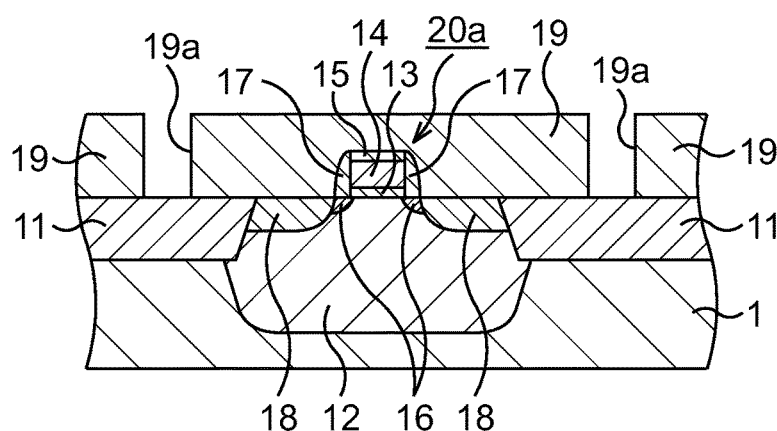
FIG. 17C is a schematic cross-sectional view illustrating, subsequent to FIG. 17B, the process in FIG. 7 in detail.

Subsequently, as illustrated in FIG. 17C, contact holes 19*a* are formed in the interlayer insulating film 19.

In more detail, the interlayer insulating film 19 is processed by lithography and dry etching. This forms the contact holes 19*a* exposing a part of surfaces of the source/drain regions 18.

Figure 18A:
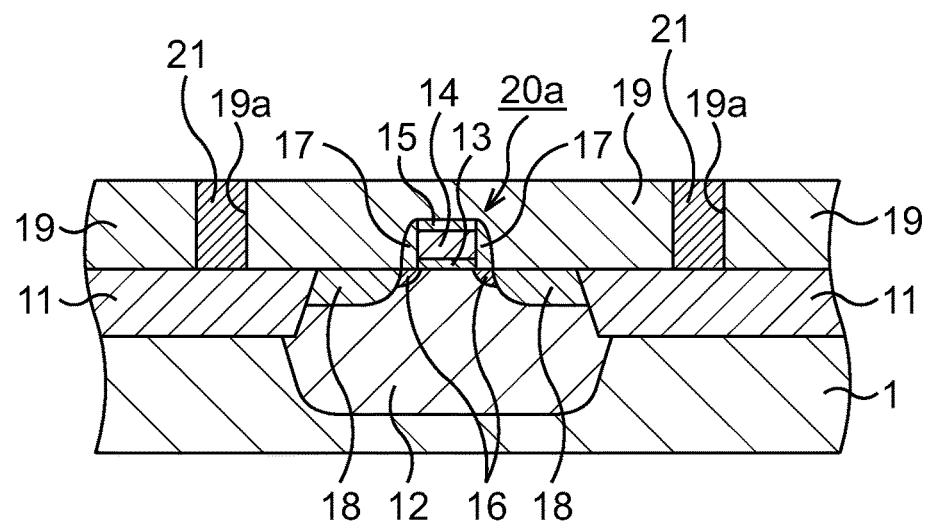
FIG. 18A is a schematic cross-sectional view illustrating, subsequent to FIG. 17C, the process in FIG. 7 in detail.

Subsequently, as illustrated in FIG. 18A, contact plugs 21 are formed.

In more detail, a conductive material, for example, tungsten (W) is deposited on the interlayer insulating film 19 by the CVD method or the like to such a thickness as to fill the contact holes 19*a*.

Surface polishing is performed on W by the CMP to leave W only in the contact holes 19*a*. Thus, the contact plugs 21 made by filling up the contact holes 19*a* with W are formed.

Figure 18B:
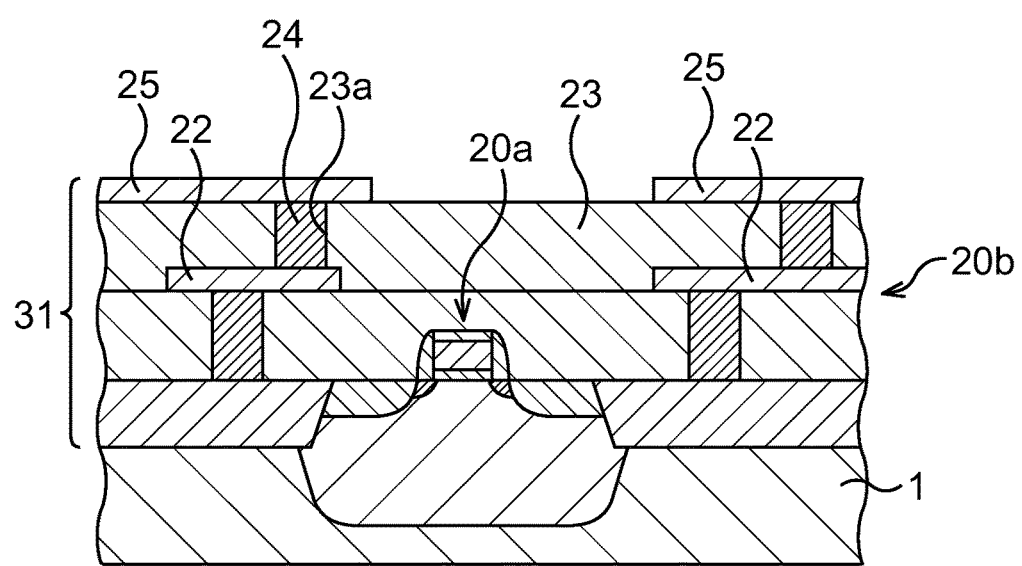
FIG. 18B is a schematic cross-sectional view illustrating, subsequent to FIG. 18A, the process in FIG. 7 in detail.

Subsequently, as illustrated in FIG. 18B, the wiring structure 20*b* is formed.

In more detail, first, a wiring material, for example, an aluminum (Al) alloy is deposited on the interlayer insulating film 19 by the sputtering method or the like, and the Al alloy is processed by lithography and dry etching. Thus, wires 22 electrically connected to the contact plugs 21 are formed on the interlayer insulating film 19.

Next, for example, a silicon oxide is deposited on the interlayer insulating film 19 in a manner to cover the wires 22 to thereby form an interlayer insulating film 23.

Then, the interlayer insulating film 23 is processed by lithography and dry etching to form via holes 23a that expose a part of the surfaces of the wires 22.

Then, a conductive material, for example, tungsten (W) is deposited on the interlayer insulating film 23 by the CVD method or the like to such a thickness as to fill the via holes 23a. Surface polishing is performed on W by the CMP to leave W only in the via holes 23a. Thus, via plugs 24 made by filling up the via holes 23a with W are formed.

Then, a wiring material, for example, an Al alloy is deposited on the interlayer insulating film 23 by the sputtering method or the like, and the Al alloy is processed by lithography and dry etching. Thus, wires 25 electrically connected to the via plugs 24 are formed on the interlayer insulating film 23.

Thus, the element layer 31 including the transistor element 20a and the wiring structure 20b is formed in the interlayer insulating films 19, 23.

Note that though the wiring structure 20b in the element layer 31 is formed of wires in two layers in the above example, wires may be formed and stacked in more layers to form the element layer.

Figure 8:
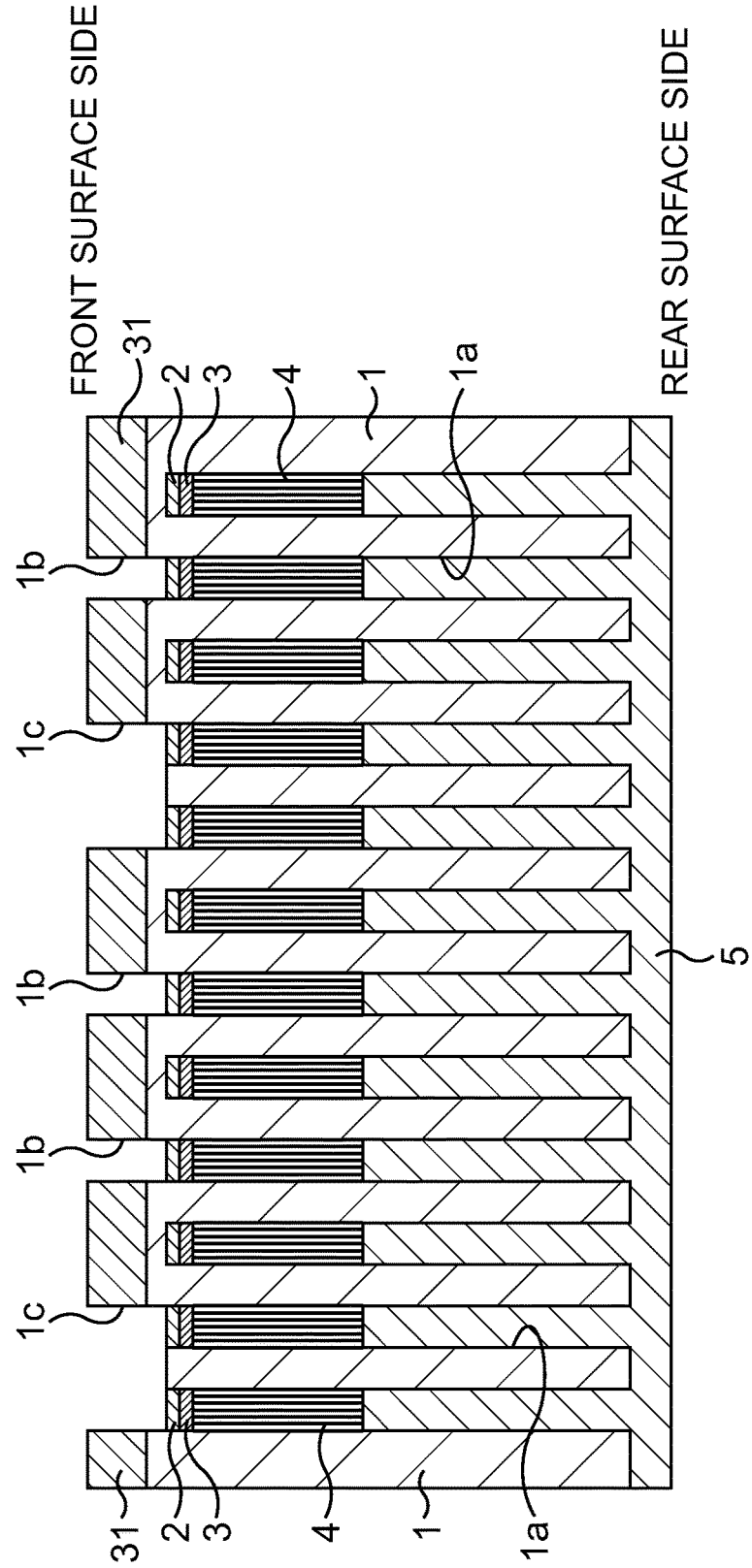
FIG. 8 is a schematic cross-sectional view illustrating, subsequent to FIG. 7, the method for manufacturing a semiconductor device according to the second embodiment in order of processes.

Subsequently, as illustrated in FIG. 8, a plurality of holes, for example, holes 1b, 1c are formed in the element layer 31 and the silicon substrate 1.

The holes 1b, 1c are formed at non-formation sites of the transistor elements 20a and the wiring structures 20b in the element layer 31. In more detail, each of the holes 1b is formed to expose the surface of the base material 2, in the above-described non-formation site and at a place corresponding to above the hole 1a. Each of the holes 1c is formed to expose the surface of the base material 2, in the above-described non-formation site and at a place corresponding to above two adjacent holes 1a. The hole 1b, 1c is formed by removing a part of the surface layers of the element layer 31 and the silicon substrate 1 by lithography and dry etching.

Note that the case of forming only the holes 1b or only the holes 1c is conceivable depending on the formation status or the like of the transistor elements 20a and the wiring structures 20b in the element layer 31.

Figure 9:
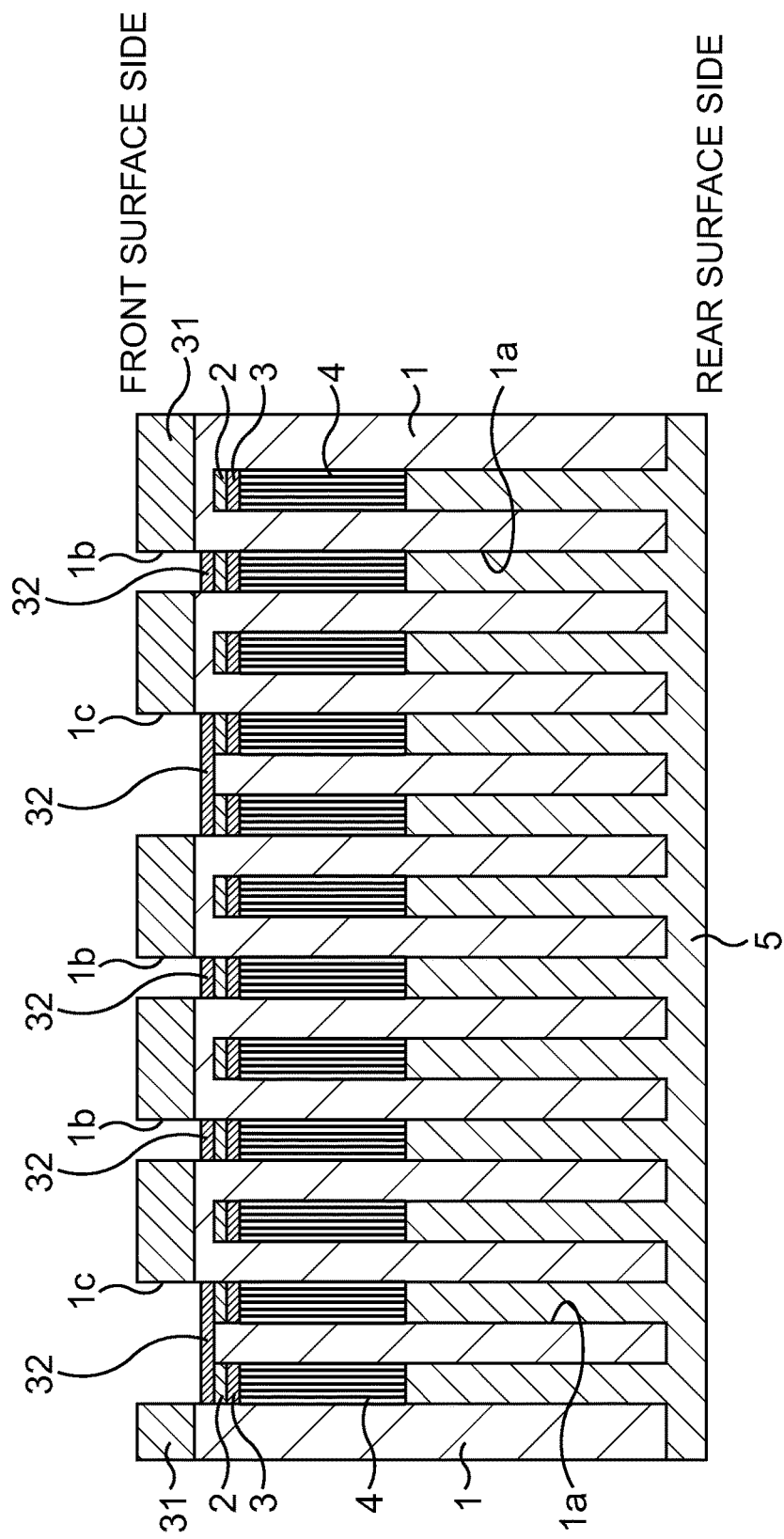
FIG. 9 is a schematic cross-sectional view illustrating, subsequent to FIG. 8, the method for manufacturing a semiconductor device according to the second embodiment in order of processes.

Subsequently, as illustrated in FIG. 9, a catalyst material 32 is formed at the bottom surface of the hole 1b, 1c.

In more detail, the catalyst material is deposited into a thickness of several nanometers, for example, about 1 nm by the vacuum deposition method or the like. As the catalyst material, a mixed material of one kind or two or more kinds selected from among Co, Ni, Fe and so on and one kind or two or more kinds selected from among Ti, TiN, TiO$_2$, V, Al and so on is used. For example, Co/Ti or Co/V is selected. This forms the catalyst material 32 at the bottom surface of the hole 1b, 1c.

Thereafter, oblique milling is performed on the front surface of the element layer 31 to remove the base material and the catalyst material deposited on the rear surface of the element layer 31. Alternatively, oblique deposition may be performed on the front surface of the element layer 31 to inactivate the catalyst material deposited on the rear surface of the element layer 31.

Figure 10:
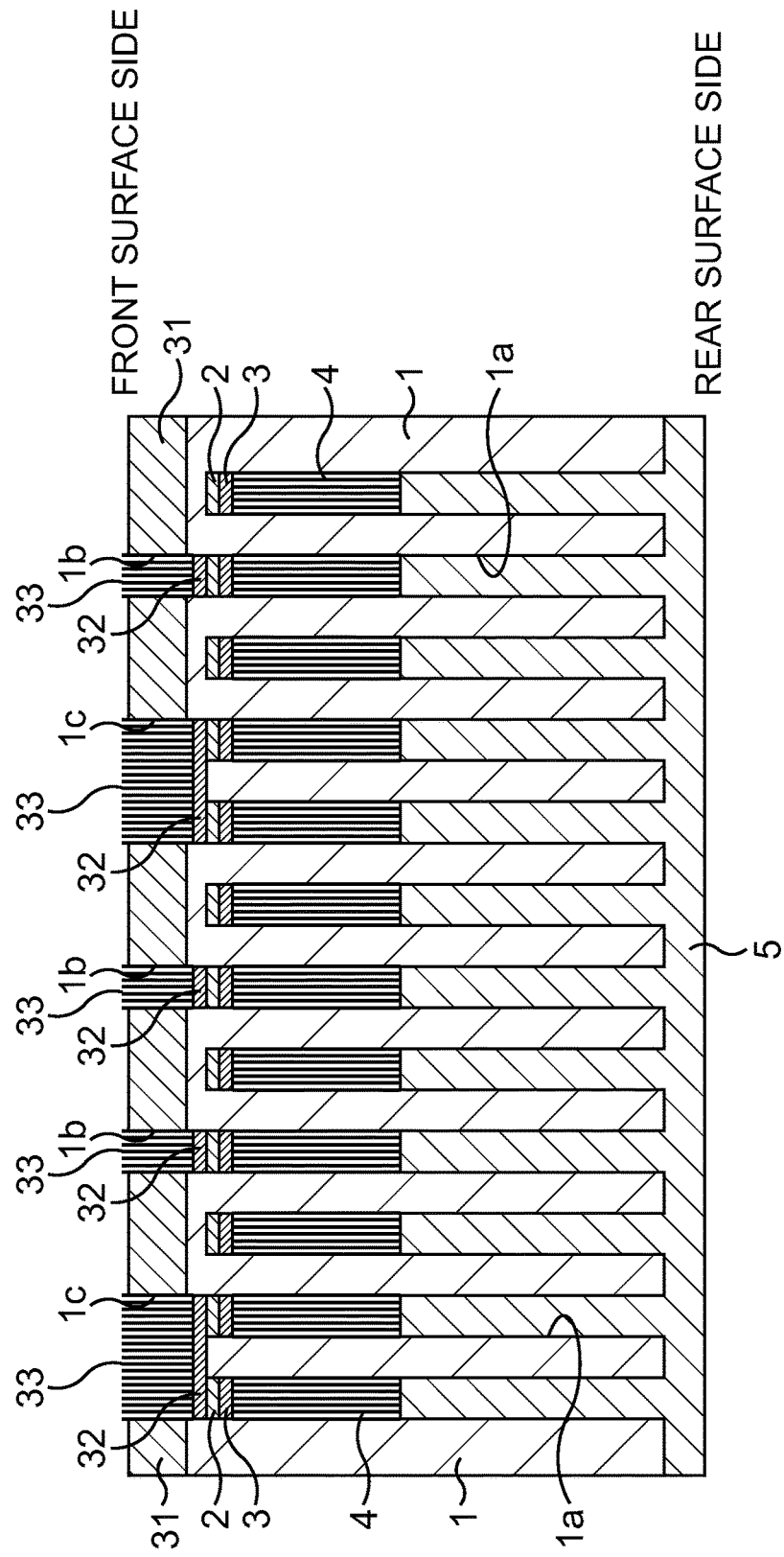
FIG. 10 is a schematic cross-sectional view illustrating, subsequent to FIG. 9, the method for manufacturing a semiconductor device according to the second embodiment in order of processes.

Subsequently, as illustrated in FIG. 10, a high heat-conducting material, for example, a CNT 33 is formed in the hole 1b, 1c.

In more detail, the plasma CVD method or the thermal CVD method is used to perform growth processing of the CNT with a temperature set to such a temperature as not to adversely affect the element layer 31, for example, about 400° C. and the application direction of an electric field set to a direction perpendicular to the substrate surface. Thus, a CNT 33 is formed to stand up from the catalyst material 32 existing at the bottom surface of the hole 1b, 1c. The CNT 33 is formed to such a length as to fill up the hole 1b, 1c. The CNT 4 in the hole 1a and the CNT 33 in the hole 1b, 1c are thermally connected to each other via the catalyst materials 3, 32 and the base material 2.

Note that after the hole 1b, 1c is formed, the base material 32 may be formed without removing the resist mask but with the resist mask kept formed. In this case, the resist mask is removed together with the catalyst material existing thereon by ashing or wet etching using a predetermined chemical, and then the CNT 33 is formed as illustrated in FIG. 10.

Figure 11:
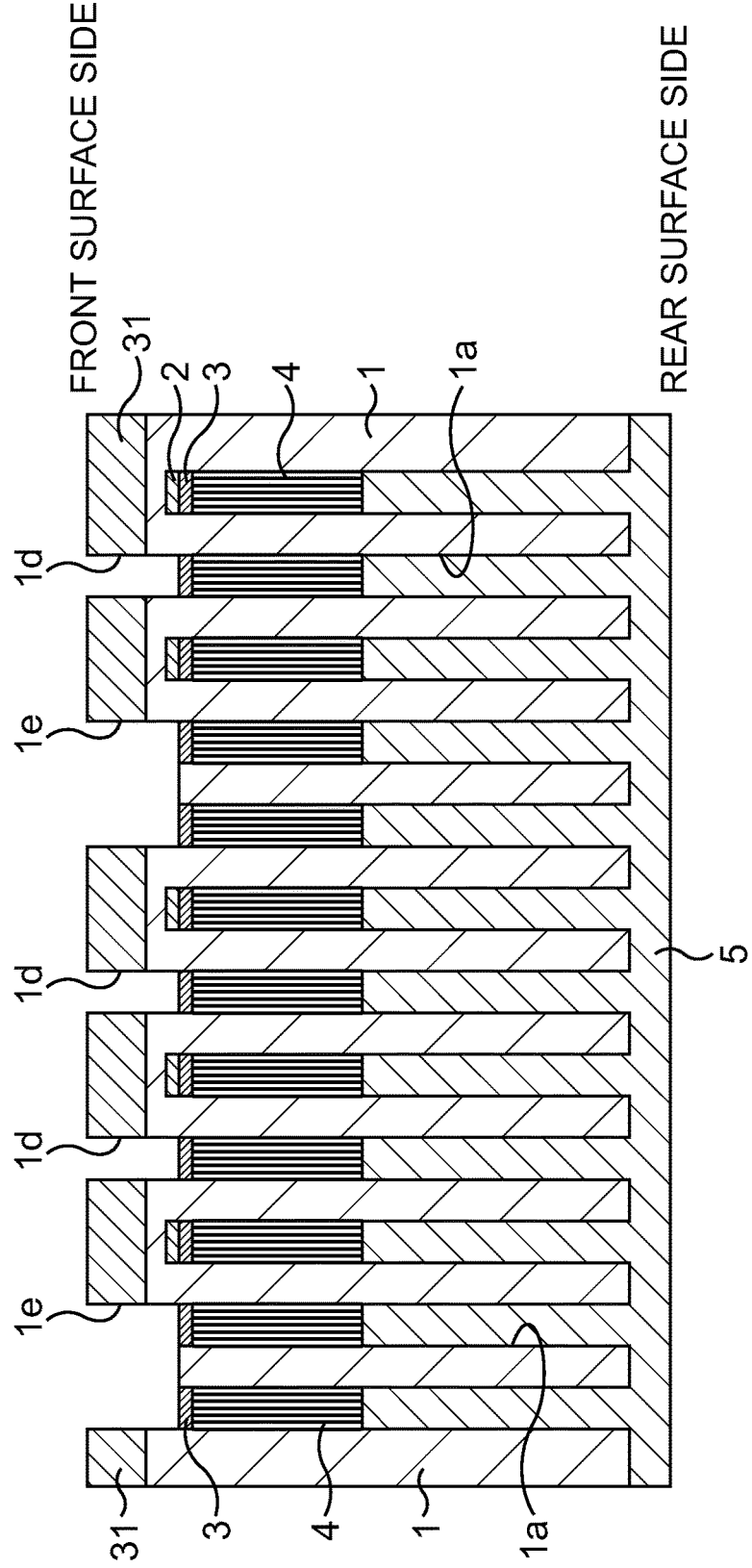
FIG. 11 is a schematic cross-sectional view illustrating a process performed in place of the process in FIG. 8.
Figure 12:
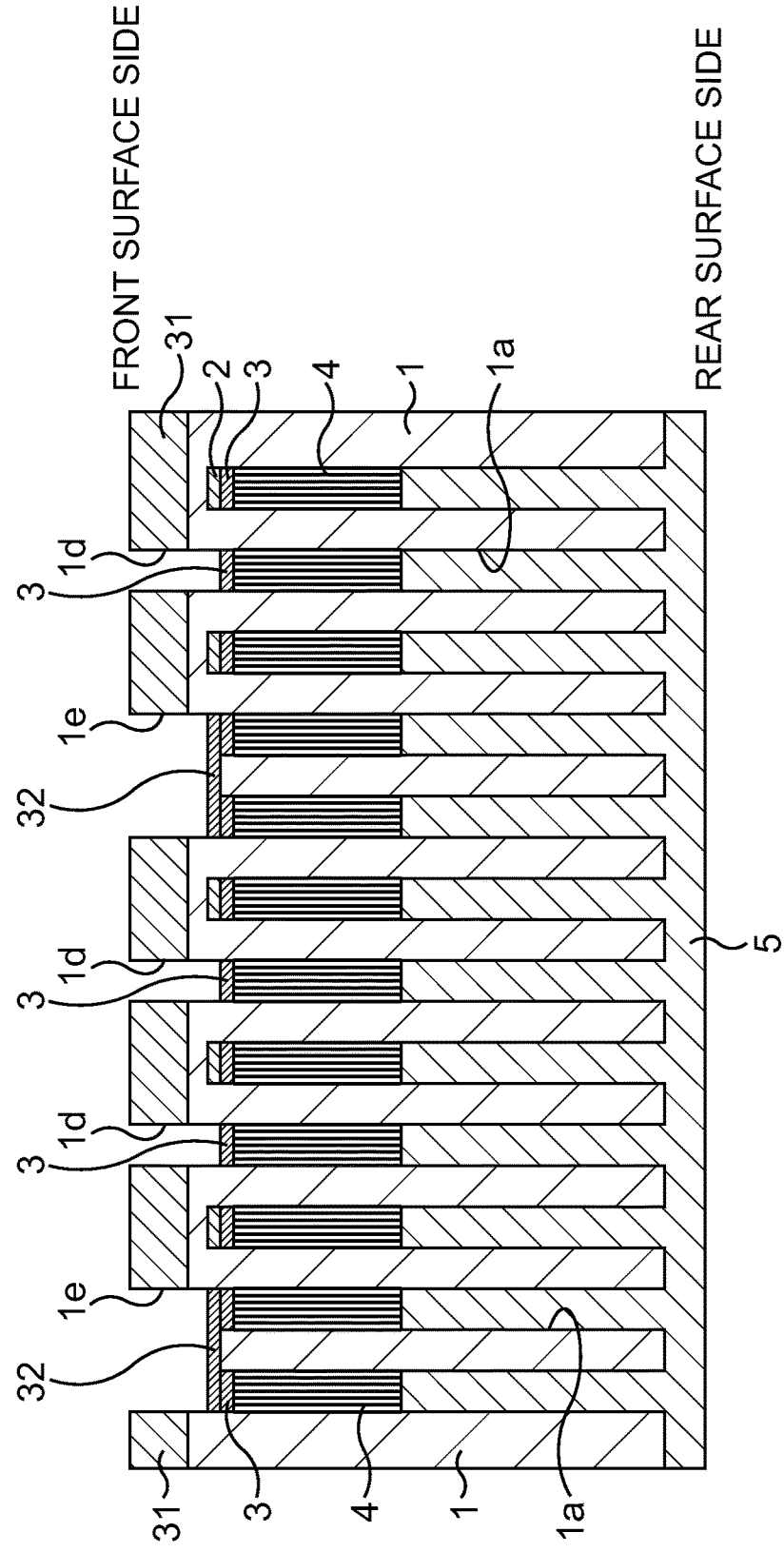
FIG. 12 is a schematic cross-sectional view illustrating a process performed in place of the process in FIG. 9.

Here, in place of the processes in FIG. 8 and FIG. 9, processes in FIG. 11 and FIG. 12 may be performed.

First, as illustrated in FIG. 11, a plurality of holes, for example, holes 1d, 1e are formed in the element layer 31 and the silicon substrate 1.

The holes 1d, 1e are formed at non-formation sites of the transistor elements 20a and the wiring structures 20b in the element layer 31. In more detail, each of the holes 1d is formed to expose the surface of the catalyst material 3, in the above-described non-formation site and at a portion corresponding to above the hole 1a. Each of the holes 1e is formed to expose the surface of the catalyst material 3, in the above-described non-formation site and at a portion corresponding to above two adjacent holes 1a. The hole 1d, 1e is formed by removing a part of the surface layers of the element layer 31 and the silicon substrate 1, and the base material 2 by lithography and dry etching.

In the state of FIG. 11, in the hole 1d, the catalyst material 3 is exposed at the bottom surface, and therefore a catalyst material does not need to be newly formed. In the hole 1e, the non-formation site of the catalyst material exists at the bottom surface, and therefore a catalyst material needs to be formed on the entire bottom surface. Hence, as illustrated in FIG. 12, a catalyst material 32 is formed at the bottom surface of the hole 11e by the vacuum deposition method or the like.

Thereafter, oblique milling is performed on the front surface of the element layer 31 to remove the catalyst material deposited on the rear surface of the element layer 31. Then, a CNT 33 is formed similarly to FIG. 10.

Figure 13:
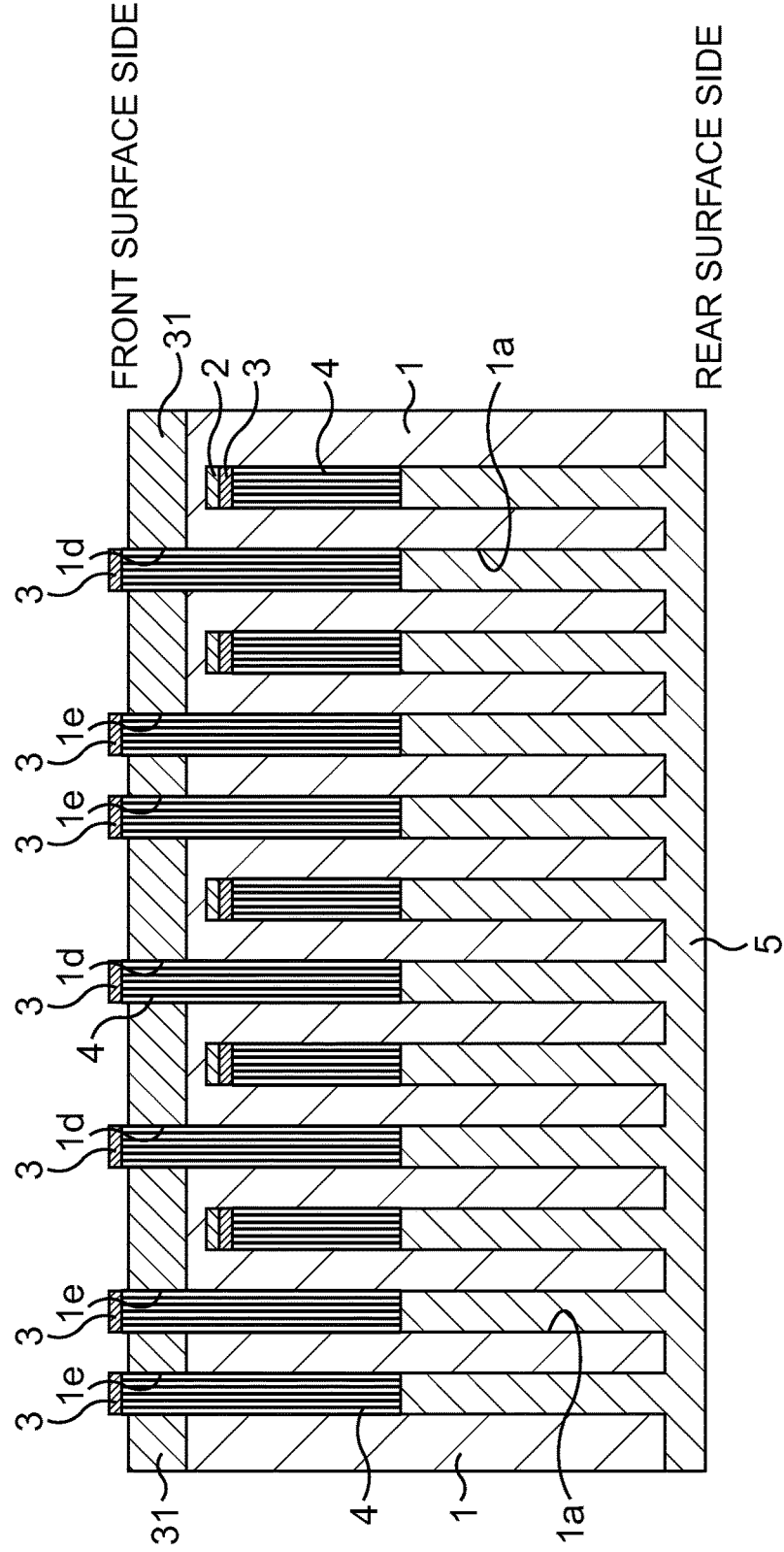
FIG. 13 is a schematic cross-sectional view illustrating a process performed in place of the processes in FIG. 8 to FIG. 10.

Further, in the case of not forming the hole 1e but forming only the hole 1d, the hole 1d is formed, and then the CNT 4 which has been already formed may be regrown at its tip as illustrated in FIG. 13 instead of forming the CNT 33. In this case, after the process in FIG. 13, the catalyst material 3 remaining at the tip of the regrown CNT 4 is removed by oblique milling.

Figure 14:
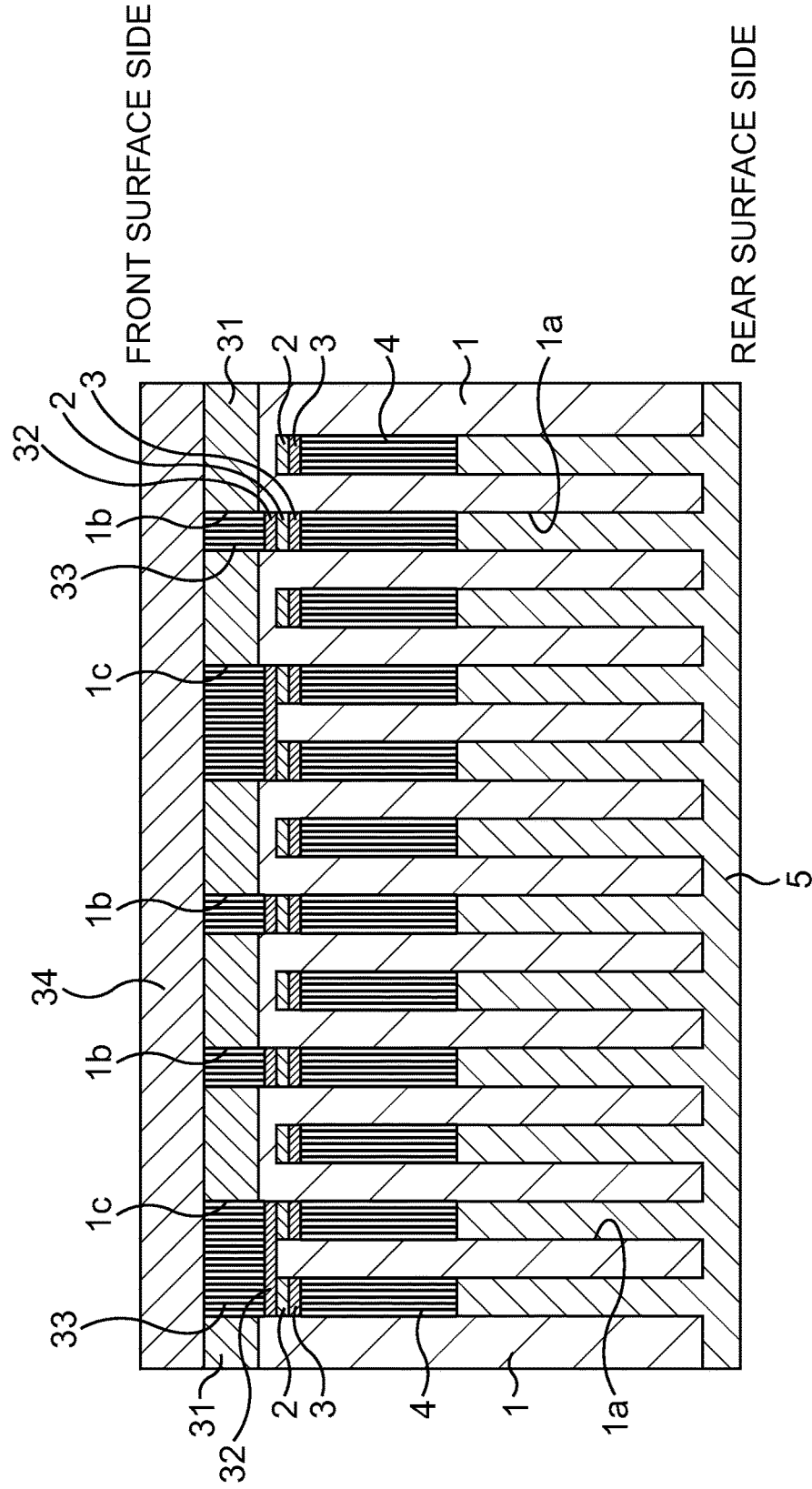
FIG. 14 is a schematic cross-sectional view illustrating, subsequent to FIG. 10, the method for manufacturing a semiconductor device according to the second embodiment in order of processes.

Subsequent to FIG. 8 to FIG. 10, a heat-conducting layer 34 is formed on the fort surface side of the silicon substrate 1 as illustrated in FIG. 14.

In more detail, a film excellent in heat conductivity, here, a DLC (Diamond Like Carbon) is formed into a thickness of, for example, about 100 nm by the photoelectron control plasma CVD method or the like in a manner to cover the front surface of the element layer 31. The heat-conducting layer 34 is thermally connected to the CNT 33 in the hole 1b, 2c.

Figure 15:
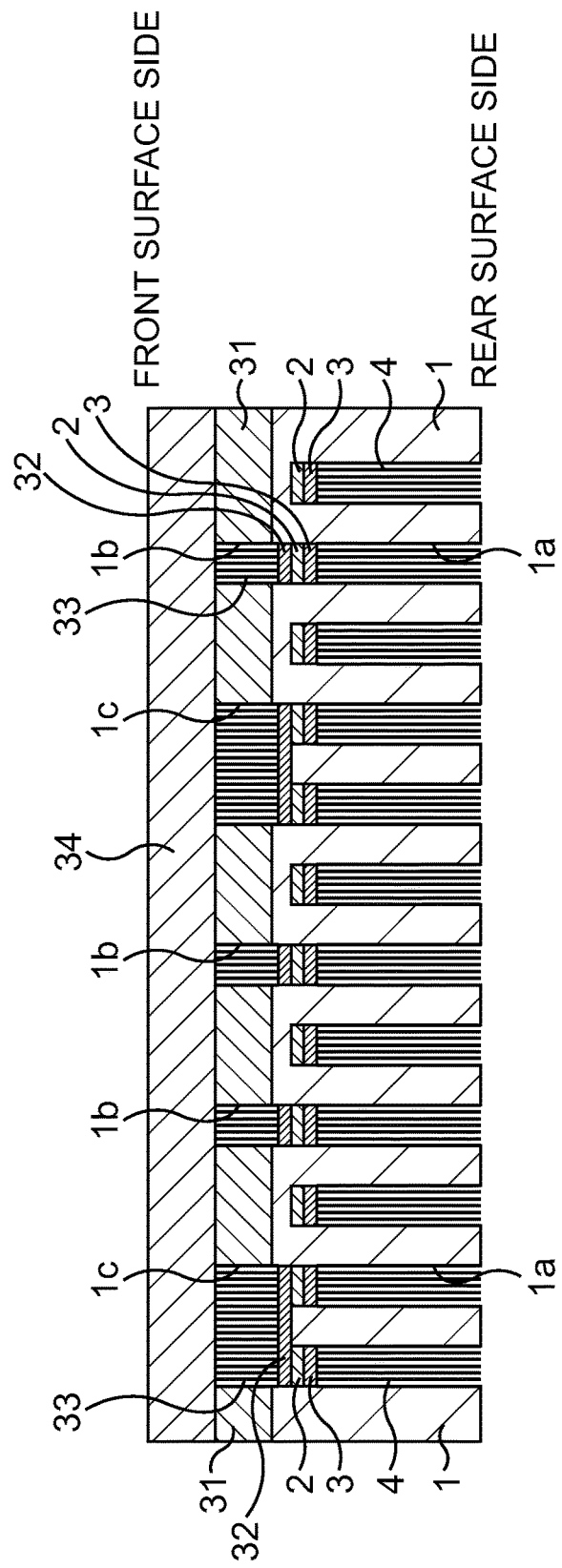
FIG. 15 is a schematic cross-sectional view illustrating, subsequent to FIG. 14, the method for manufacturing a semiconductor device according to the second embodiment in order of processes.

Subsequently, as illustrated in FIG. 15, the sealing material 5 is removed by grinding the rear surface of the silicon substrate 1.

In more detail, the rear surface of the silicon substrate 1 is ground by grinding or the like to such an extent as to expose the tip of the CNT 4 in the hole 1a. This appropriately thins the silicon substrate 1 to remove the sealing material 5. In this event, the thickness of the total of the silicon substrate 1 and the element layer 31 is made to, for example, about 50 μm to about 100 μm. In the case where the sealing material 5 is applied using the high heat-conducting material so that the length of the CNT 4 becomes as short as about 50 μm, the sealing material 5 in the hole 1a may remain.

Figure 16:
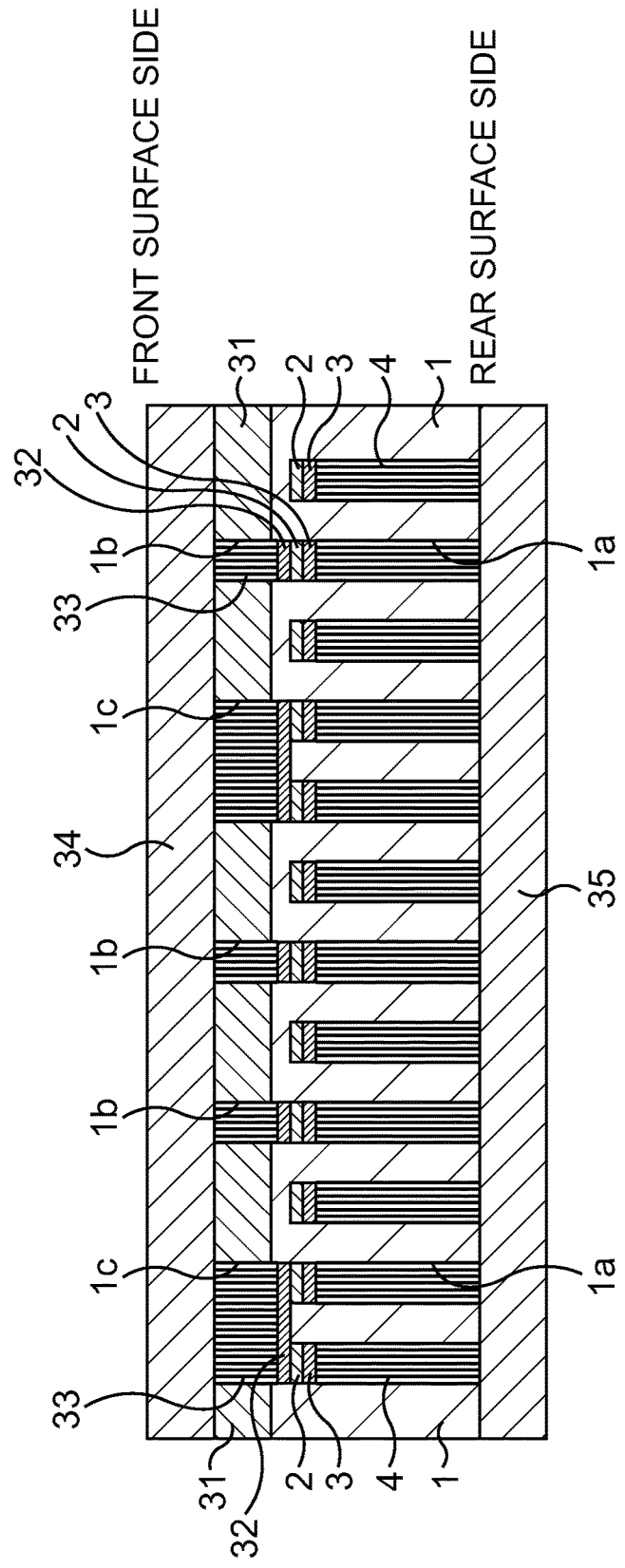
FIG. 16 is a schematic cross-sectional view illustrating, subsequent to FIG. 15, the method for manufacturing a semiconductor device according to the second embodiment in order of processes.

Subsequently, as illustrated in FIG. 16, a heat-conducting layer 35 is formed on the rear surface side of the silicon substrate 1.

In more detail, a film excellent in heat conductivity, here, a DLC is formed into a thickness of, for example, about 100 nm by the photoelectron control plasma CVD method or the like in a manner to cover the rear surface of the silicon substrate 1. The heat-conducting layer 35 is thermally connected to the CNT 4 in the hole 1a.

Thereafter, a dicing process is performed to cut out each semiconductor chip.

In this embodiment, the thermally connected CNTs 4, 33 and heat-conducting layers 34, 35 constitute the heat release mechanism for the semiconductor device, on the front and rear surfaces of the silicon substrate 1 via the inside of the silicon substrate 1. In this heat release mechanism, heat generated in the element layer 31 and the like is conducted in the vertical direction by the CNTs 4, 33, conducted over the horizontal direction by the heat-conducting layers 34, 35, and is thus efficiently exhausted.

As has been described above, according to this embodiment, a highly-reliable semiconductor device enabling very efficient heat release with a relatively simple configuration is realized.

Modification Example

Here, a modification example of the second embodiment will be described.

Figure 19:
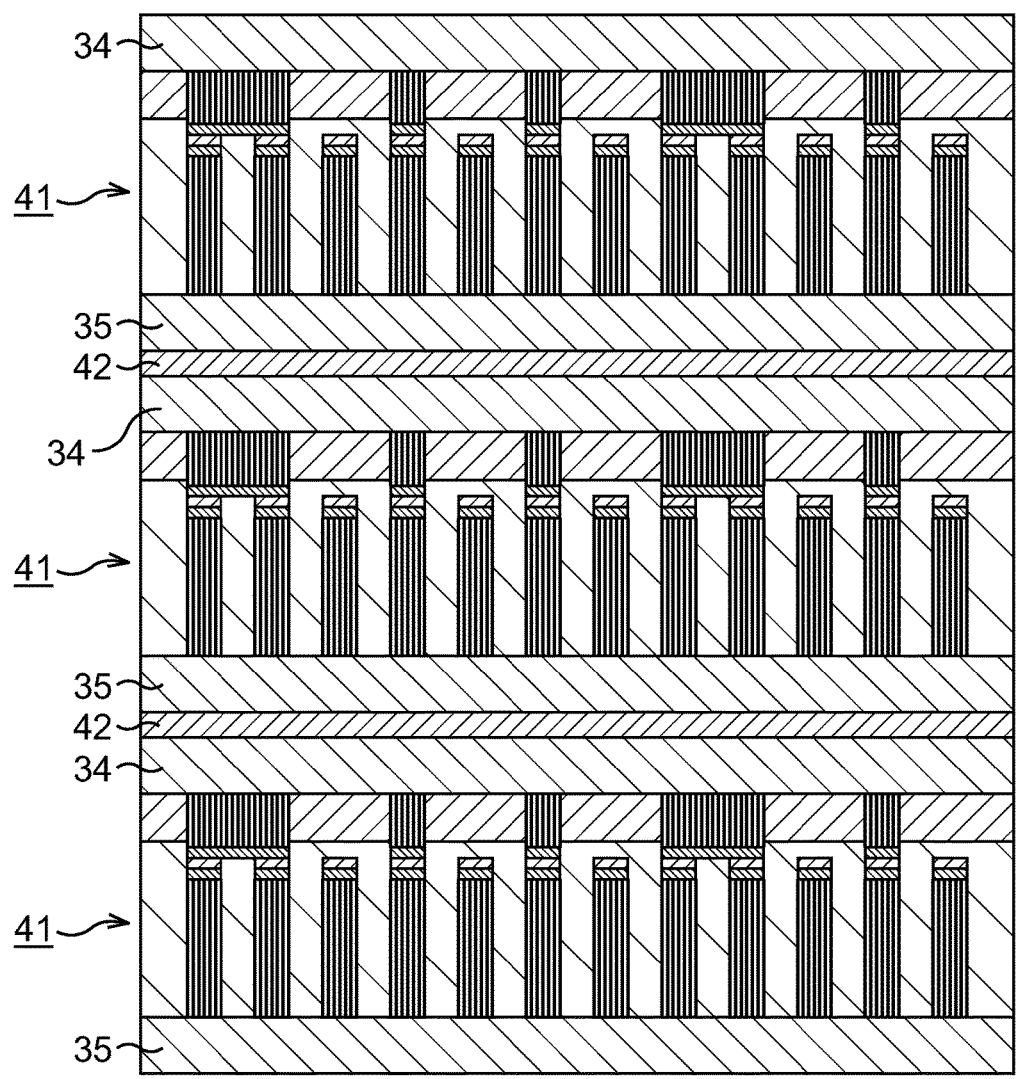
FIG. 19 is a cross-sectional view illustrating a schematic configuration of a stacked semiconductor device according to a modification example of the second embodiment.

FIG. 19 is a cross-sectional view illustrating a schematic configuration of a stacked semiconductor device according to the modification example of the second embodiment.

In this example, a plurality of the semiconductor devices in FIG. 16 manufactured by the second embodiment (referred to as semiconductor devices 41) are stacked via adhesive layers 42 to fabricate the stacked semiconductor device.

The adhesive layer 42 is formed into a thickness of about several micrometers using a material excellent in adhesion for the heat-conducting layers 34, 35 and high in heat conductivity, such as indium or metal paste.

In this stacked semiconductor device, the heat-conducting layer 34 of the semiconductor device 41 on the lower side and the heat-conducting layer 35 of the semiconductor device 41 on the upper side are thermally connected to each other via the adhesive layer 42 so that the heat release mechanisms in the respective semiconductor devices 41 are thermally integrated together. With this configuration, very efficient heat exhaustion is realized.

Figure 20:
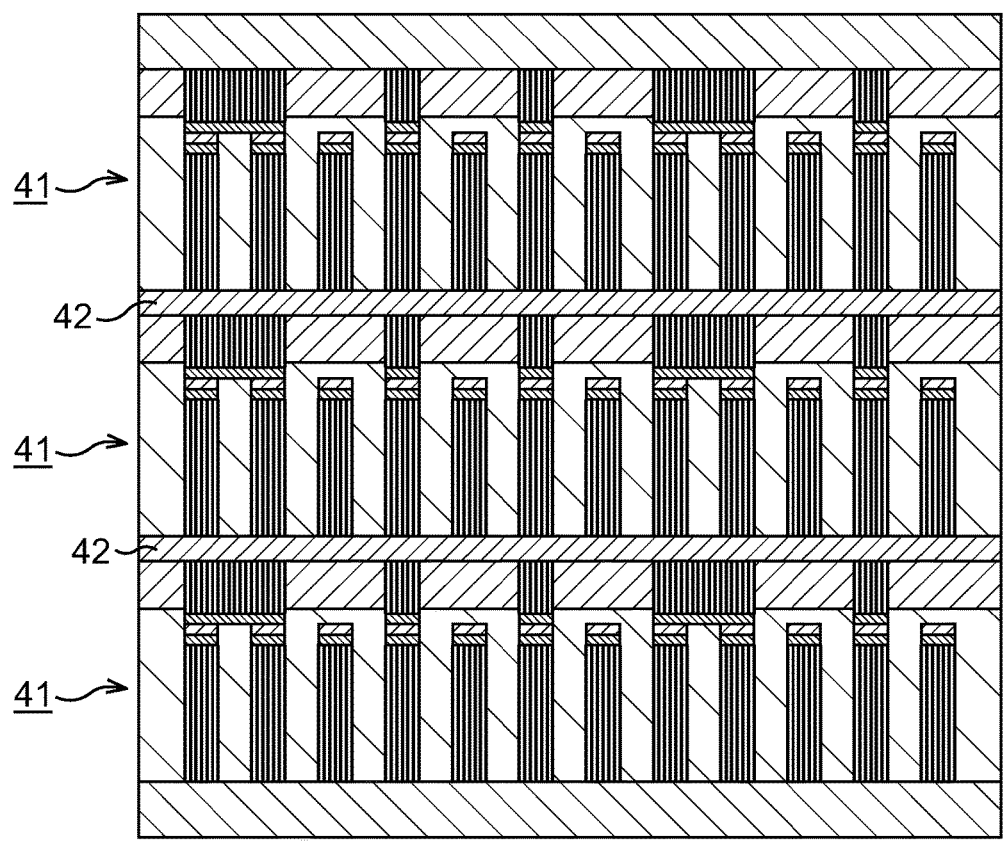
FIG. 20 is a cross-sectional view illustrating a schematic configuration of a stacked semiconductor device according to another example of the modification example of the second embodiment.

Further, as another example of this example, the upper and lower semiconductor devices 41 may be bonded and fixed together using the adhesive layer 42 without forming the heat-conducting layers 34, 35 in the semiconductor devices 41 as illustrated in FIG. 20. With this configuration, a stacked semiconductor device that is thin and small as a whole is realized.

Third Embodiment

This embodiment discloses a semiconductor device having a heat release mechanism formed in a silicon substrate itself as in the second embodiment, but is different from the first embodiment in that first and second heat-conductive films are different and so on.

Figure 21:
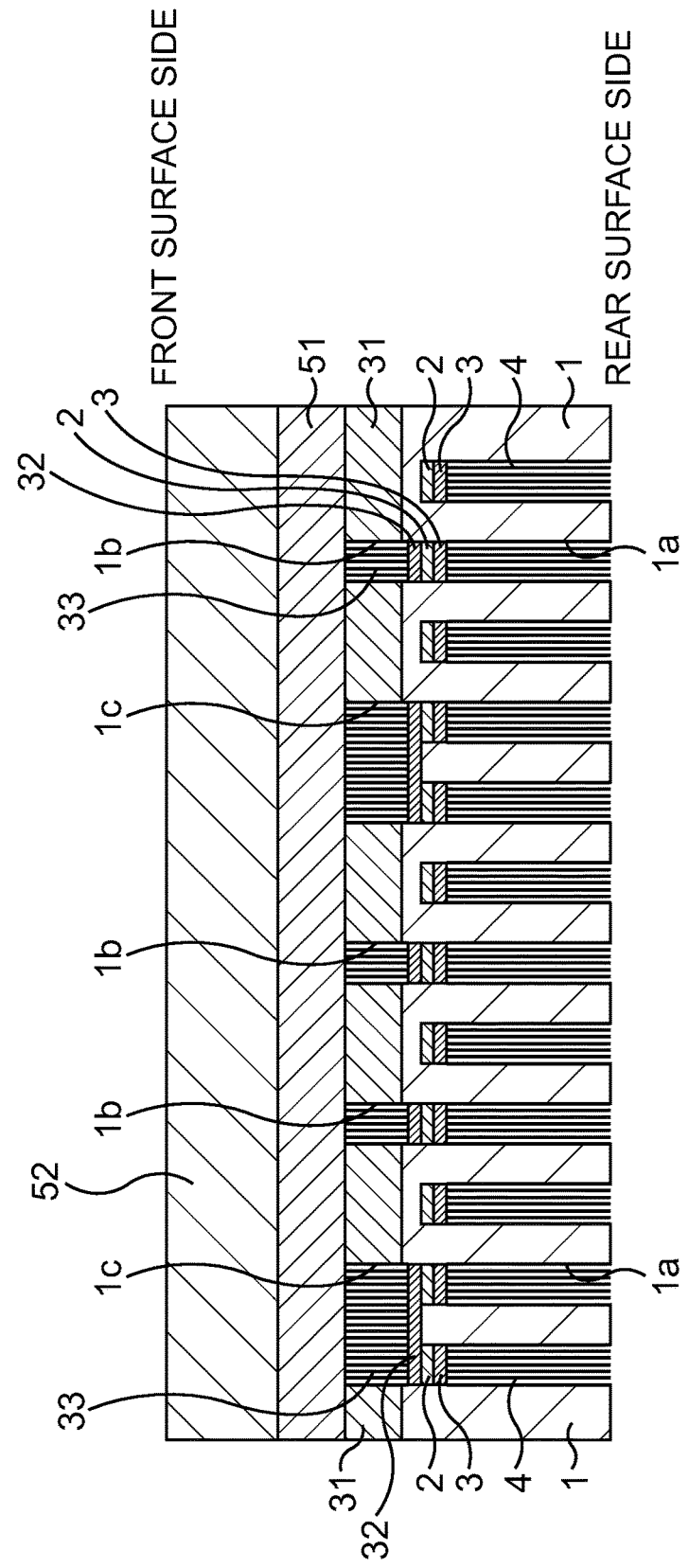
FIG. 21 is a schematic cross-sectional view illustrating main processes of a method for manufacturing a semiconductor device according to a third embodiment.
Figure 22:
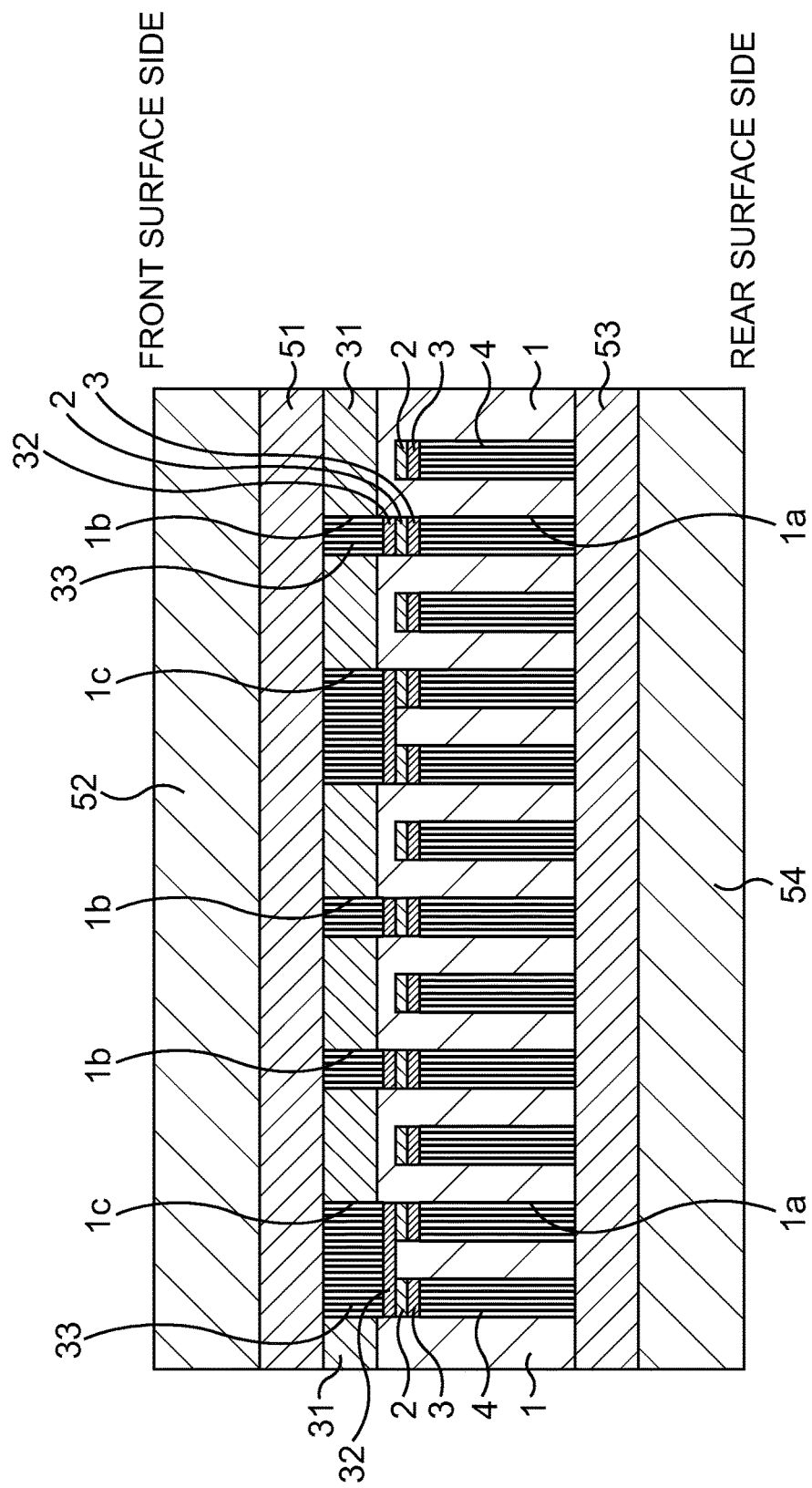
FIG. 22 is a schematic cross-sectional view illustrating, subsequent to FIG. 21, the main processes of the method for manufacturing a semiconductor device according to the third embodiment.
Figure 23:
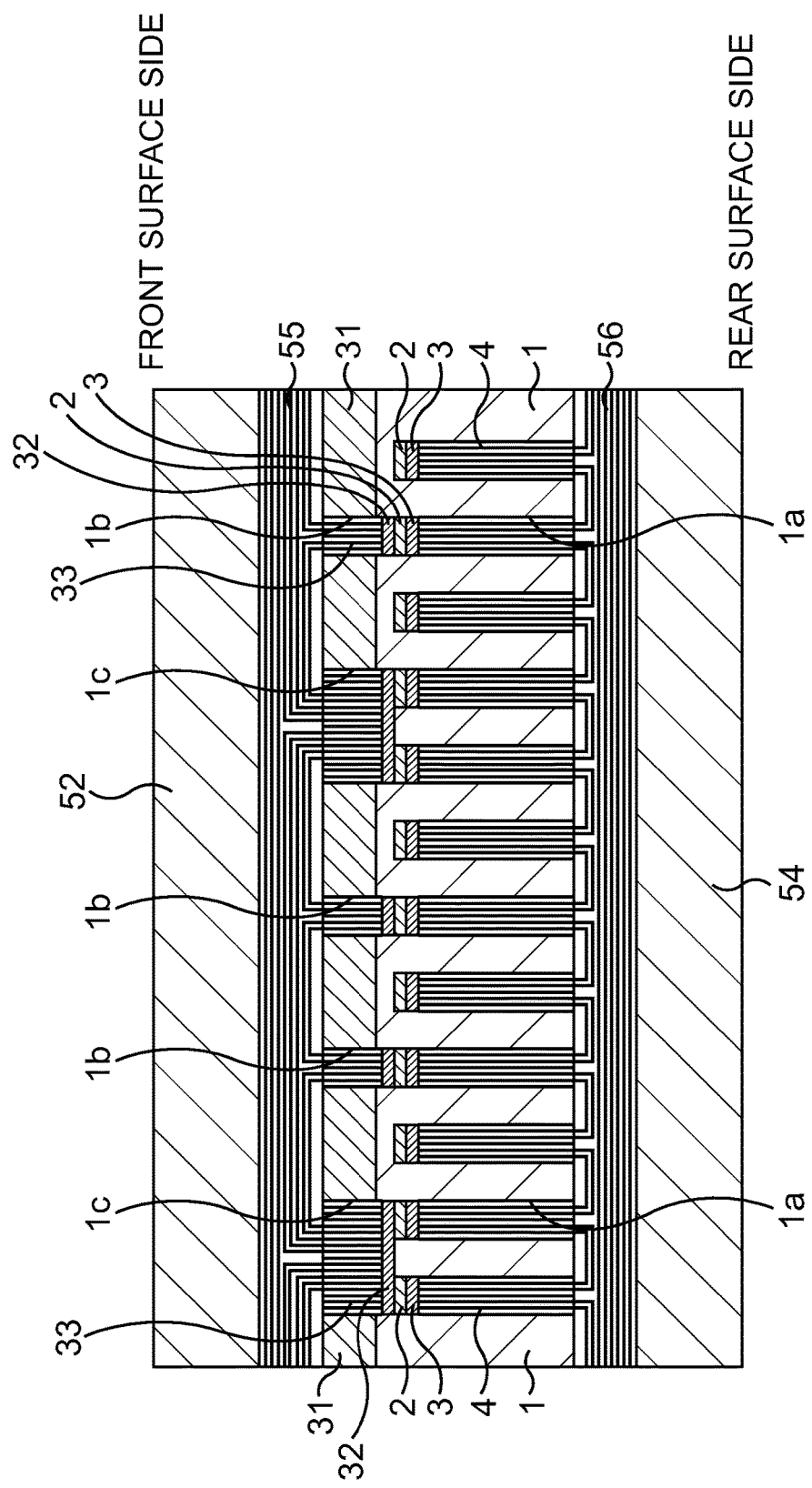
FIG. 23 is a schematic cross-sectional view illustrating, subsequent to FIG. 22, the main processes of the method for manufacturing a semiconductor device according to the third embodiment.

FIG. 21 to FIG. 23 are schematic cross-sectional views illustrating main processes of a method for manufacturing a semiconductor device according to a third embodiment. Note that the same signs are given to the same components and so on as those of the semiconductor device according to the second embodiment to omit their detailed description.

First, the processes in FIG. 7 to FIG. 10 are performed as in the second embodiment.

Subsequently, an amorphous carbon layer 51 and a catalyst layer 52 are formed in sequence on the front surface side of the silicon substrate 1 as illustrated in FIG. 21.

In more detail, first, the amorphous carbon layer 51 is formed into a thickness of, for example, about 60 nm by the sputtering method or the like in a manner to cover the front surface of the element layer 31. The amorphous carbon layer 51 is in contact with the CNT 33 in the hole 1b, 2c.

Then, the catalyst layer 52 that becomes a catalyst for later-described graphene growth is formed on the amorphous carbon layer 51. The catalyst layer 52 is formed into a thickness of, for example, about 100 nm using at least one kind selected from among Co, Ni, Pt, Fe and so on, for example, Co as a material by the sputtering method or the like.

Subsequently, the rear surface of the silicon substrate 1 is ground to remove the sealing material 5 as in FIG. 15 of the second embodiment.

Subsequently, as illustrated in FIG. 22, an amorphous carbon layer 53 and a catalyst layer 54 are formed in sequence on the rear surface side of the silicon substrate 1.

In more detail, the amorphous carbon layer 53 is formed into a thickness of, for example, about (60 nm) by the (sputtering) method or the like in a manner to cover the rear surface of the silicon substrate 1. The amorphous carbon layer 53 is in contact with the CNT 4 in the hole 1a.

Then, the catalyst layer 54 that becomes a catalyst for later-described graphene growth is formed on the amorphous carbon layer 53. The catalyst layer 54 is formed into a thickness of, for example, about 100 nm using at least one kind selected from among Co, Ni, Pt, Fe and so on, for example, Co as a material by the sputtering method or the like.

Subsequently, as illustrated in FIG. 23, graphene layers 55, 56 are formed by heat treatment.

In more detail, the structure in FIG. 22 is heat-treated at about 400° C. to about 1000° C., for example, about 800° C. This causes the catalyst layer 52 to serve as a catalyst, whereby the amorphous carbon in the amorphous carbon layer 51 becomes graphene to form into the graphene layer 55. Simultaneously, the catalyst layer 54 serves as a catalyst, whereby the amorphous carbon in the amorphous carbon layer 53 becomes graphene to form into the graphene layer 56.

In the graphene layer 55, at a contact site with the CNT 33, the CNT 33 is regrown and formed integrally with the graphene. This ensures excellent thermal connection between the CNT 33 and the graphene layer 55.

In the graphene layer 56, at a contact site with the CNT 4, the CNT 4 is regrown and formed integrally with the graphene. This ensures excellent thermal connection between the CNT 4 and the graphene layer 56.

Thereafter, the dicing process is performed to cut out each semiconductor chip.

In this embodiment, the CNTs 4, 33 and the graphene layers 55, 56 which are integrated and surely thermally connected constitute the heat release mechanism for the semiconductor device, on the front and rear surfaces of the silicon substrate 1 via the inside of the silicon substrate 1. In this heat release mechanism, heat generated in the element layer 31 and the like is conducted in the vertical direction in the CNTs 4, 33, conducted over the horizontal direction in the graphene layers 55, 56, and is thus very efficiently exhausted.

As has been described above, according to this embodiment, a highly-reliable semiconductor device enabling very efficient heat release with a relatively simple configuration is realized.

Modification Example

Here, a modification example of the third embodiment will be described.

Figure 24:
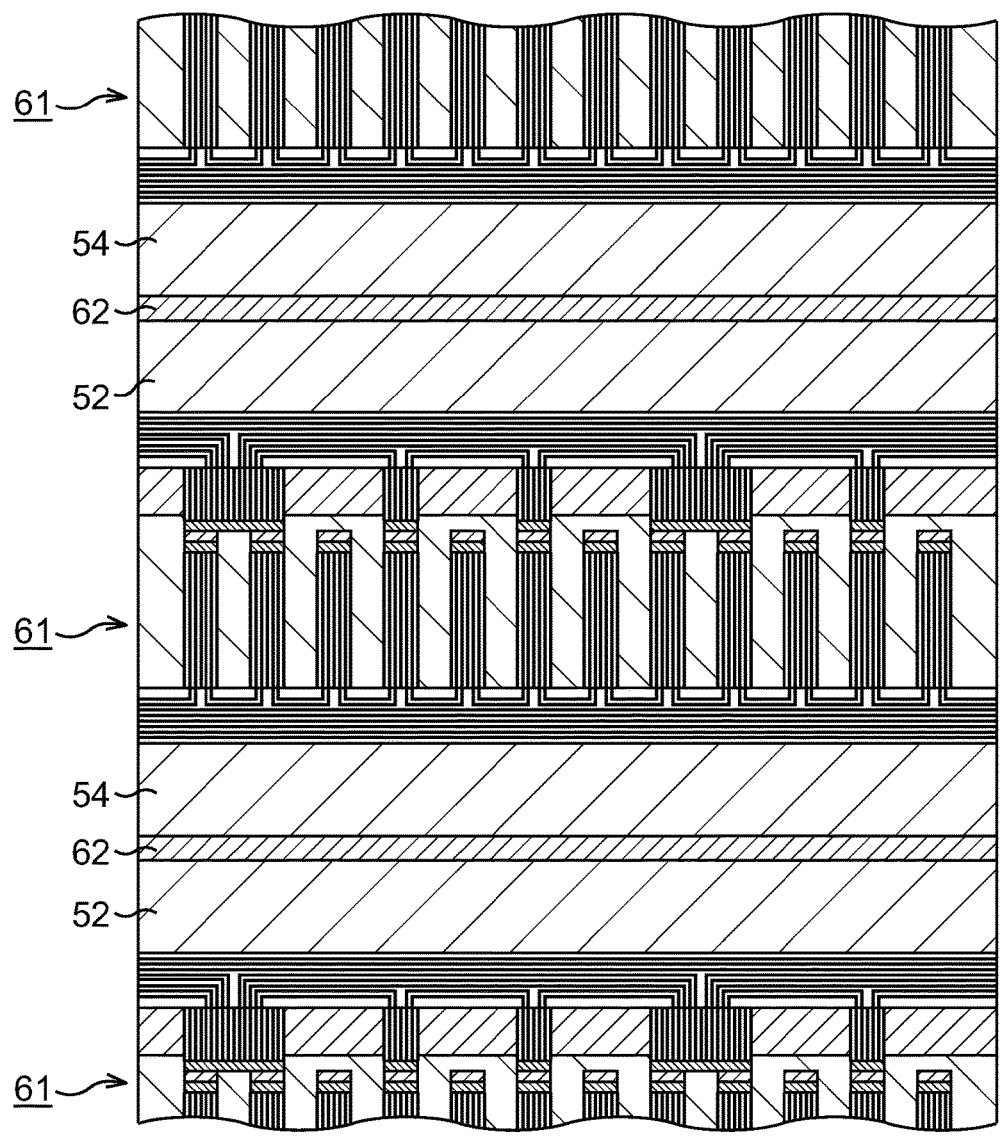
FIG. 24 is a cross-sectional view illustrating a schematic configuration of a stacked semiconductor device according to a modification example of the third embodiment.

FIG. 24 is a cross-sectional view illustrating a schematic configuration of a stacked semiconductor device according to the modification example of the third embodiment.

In this example, a plurality of the semiconductor devices in FIG. 22 manufactured by the third embodiment (referred to as semiconductor devices 61) are stacked via adhesive layers 62 to fabricate the stacked semiconductor device.

The adhesive layer 62 is formed into a thickness of about several micrometers using a material excellent in adhesion for the catalyst layers 52, 54 and high in heat conductivity, such as indium or metal paste.

In this stacked semiconductor device, the catalyst layer 52 of the semiconductor device 61 on the lower side and the catalyst layer 54 of the semiconductor device 61 on the upper side are thermally connected to each other via the adhesive layer 62 so that the heat release mechanisms in the respective semiconductor devices 61 are thermally integrated together. With this configuration, very efficient heat exhaustion is realized.

Figure 25:
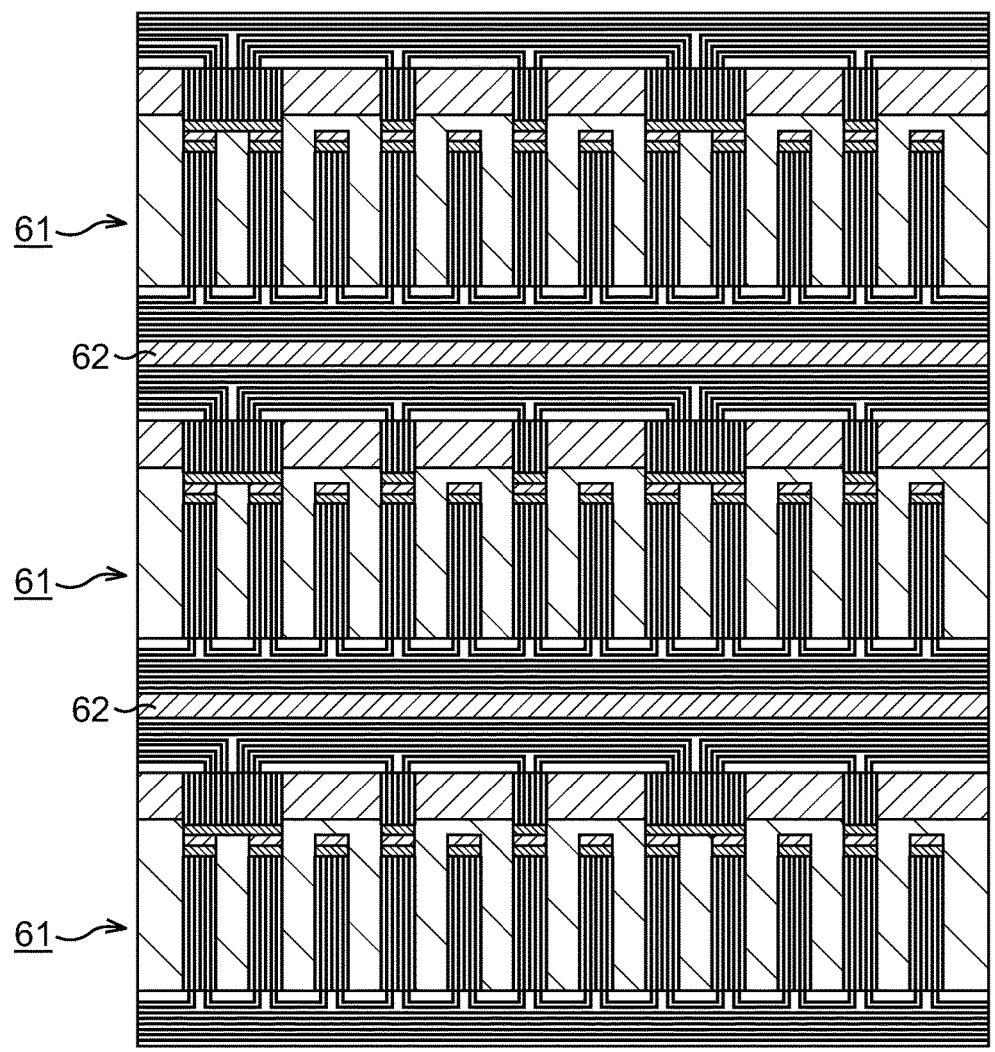
FIG. 25 is a cross-sectional view illustrating a schematic configuration of a stacked semiconductor device according to another example of the modification example of the third embodiment.

Further, as another example of this example, the upper and lower semiconductor devices 61 may be bonded and fixed together using the adhesive layer 62 after the catalyst layers 52, 54 of the semiconductor devices 61 are removed using acid or the like as illustrated in FIG. 25. With this configuration, a stacked semiconductor device that is thin and small as a whole is realized.

The present invention realizes highly-reliable electronic device and substrate structure enabling very efficient heat release with a relatively simple configuration.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device, comprising:
a substrate that includes a heat release mechanism formed on a rear surface thereof; and
an element layer that includes a functional element and is formed on a front surface of the substrate,
the heat release mechanism including:
a first high heat-conducting material that is higher in heat conductivity than the substrate and is formed in a plurality of first holes formed in the rear surface of the substrate;
a second high heat-conducting material that is higher in heat conductivity than the substrate and is formed, in a second hole formed penetrating the element layer on the front surface of the substrate, to be thermally connected to the first high heat-conducting material;
a first heat-conductive film that is thermally connected to the first high heat-conducting material in a manner to cover a rear surface side of the substrate; and
a second heat-conductive film that is thermally connected to the second high heat-conducting material in a manner to cover a front surface side of the substrate, wherein:
the second high heat-conducting material is a first carbon nanotube;
the second heat-conductive film is formed including graphene; and
a first catalyst film that is to grow the graphene and covers the second heat-conductive film is further included.

2. The electronic device according to claim 1, wherein:
the first heat-conductive film is formed including graphene; and
a second catalyst film that is to grow the graphene and covers the first heat-conductive film is further included.

3. A stacked electronic device comprising:
a plurality of the electronic devices according to claim 1, the electronic devices being stacked via an adhesive layer.

4. The electronic device according to claim 1, wherein the first high heat-conducting material is a second carbon nanotube.

5. The electronic device according to claim 4, wherein the heat release mechanism includes a catalyst to grow the second carbon nanotube, between a bottom surface of the first hole and an end portion of the second carbon nanotube.

6. The electronic device according to claim 5, wherein the heat release mechanism includes a first base material, between the bottom surface of the first hole and the catalyst.

7. A method for manufacturing an electronic device, comprising:
forming a plurality of first holes in a rear surface of a substrate;
forming a first high heat-conducting material that is higher in heat conductivity than the substrate, in the first hole;
forming an element layer that includes a functional element, on a front surface of the substrate;
forming a second hole penetrating the element layer on the front surface of the substrate;
forming a second high heat-conducting material to be thermally connected to the first high heat-conducting material, in the second hole;
forming a first heat-conductive film that is to be thermally connected to the first high heat-conducting material in a manner to cover a rear surface side of the substrate;
forming a second heat-conductive film that is to be thermally connected to the second high heat-conducting material in a manner to cover a front surface side of the substrate;
forming a first catalyst film to grow graphene in a manner to cover the second heat-conductive film; and
heat-treating the second heat-conductive film to form the graphene, wherein the second high heat-conducting material is a first carbon nanotube.

8. The method for manufacturing an electronic device according to claim 7, further comprising:
- forming a second catalyst film to grow graphene in a manner to cover the first heat-conductive film; and
- heat-treating the first heat-conductive film to form the graphene.

9. The method for manufacturing an electronic device according to claim 7, further comprising:
- forming the first high heat-conducting material from a bottom surface of the first hole to a middle depth of the first hole; and
- embedding a sealing material in the first hole from the front surface of the substrate to seal the first high heat-conducting material in the substrate, wherein
- in a state that the sealing material seals the first high heat-conducting material in the substrate, the element layer is formed.

10. The method for manufacturing an electronic device according to claim 7, wherein
- the first high heat-conducting material is a second carbon nanotube.

* * * * *